(12) United States Patent
Lee

(10) Patent No.: US 11,569,263 B2
(45) Date of Patent: Jan. 31, 2023

(54) SEMICONDUCTOR MEMORY DEVICE AND MANUFACTURING METHOD OF THE SEMICONDUCTOR MEMORY DEVICE

(71) Applicant: SK hynix Inc., Icheon-si (KR)

(72) Inventor: Nam Jae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 177 days.

(21) Appl. No.: 17/074,062

(22) Filed: Oct. 19, 2020

(65) Prior Publication Data

US 2021/0358944 A1 Nov. 18, 2021

(30) Foreign Application Priority Data

May 15, 2020 (KR) ........................ 10-2020-0058646

(51) Int. Cl.
| | |
|---|---|
| *H01L 27/11582* | (2017.01) |
| *H01L 27/11565* | (2017.01) |
| *H01L 27/11573* | (2017.01) |
| *G11C 7/18* | (2006.01) |
| *H01L 27/11556* | (2017.01) |
| *H01L 27/11526* | (2017.01) |
| *H01L 27/11519* | (2017.01) |

(52) U.S. Cl.
CPC ......... *H01L 27/11582* (2013.01); *G11C 7/18* (2013.01); *H01L 27/11519* (2013.01); *H01L 27/11526* (2013.01); *H01L 27/11556* (2013.01); *H01L 27/11565* (2013.01); *H01L 27/11573* (2013.01)

(58) Field of Classification Search
CPC .................... H01L 27/11578; H01L 27/11582
See application file for complete search history.

(56) References Cited

U.S. PATENT DOCUMENTS

| | | | |
|---|---|---|---|
| 9,536,894 B2 | 1/2017 | Tajima et al. | |
| 2018/0366483 A1 | 12/2018 | Choi | |
| 2019/0198065 A1 | 6/2019 | Russo | |
| 2020/0273501 A1* | 8/2020 | Yun | ...................... H01L 23/5226 |
| 2021/0066343 A1* | 3/2021 | Choi | ................... H01L 29/4234 |

\* cited by examiner

*Primary Examiner* — Christopher A Johnson
(74) *Attorney, Agent, or Firm* — William Park & Associates Ltd.

(57) ABSTRACT

There are provided a semiconductor memory device and a manufacturing method of the semiconductor memory device. The semiconductor device includes: a first stack structure including interlayer insulating layers and first conductive patterns, which are alternately stacked; a second stack structure including a second conductive pattern overlapping with the first stack structure, and a third conductive pattern overlapping with the first stack structure with the second conductive pattern interposed between the first stack structure and the third conductive pattern, the third conductive pattern having an oxidation rate different from that of the second conductive pattern; channel structures penetrating the first stack structure and the second stack structure; and a bit line overlapping with the first stack structure with the second stack structure interposed between the first stack structure and the bit line.

22 Claims, 23 Drawing Sheets

SEMICONDUCTOR MEMORY DEVICE AND MANUFACTURING METHOD OF THE SEMICONDUCTOR MEMORY DEVICE

CROSS-REFERENCE TO RELATED APPLICATION

The present application claims priority under 35 U.S.C. § 119(a) to Korean patent application number 10-2020-0058646 filed on May 15, 2020, in the Korean Intellectual Property Office, the entire disclosure of which is incorporated by reference herein.

BACKGROUND

1. Technical Field

The present disclosure generally relates to a semiconductor memory device and a manufacturing method of the semiconductor memory device, and more particularly, to a three-dimensional semiconductor memory device and a manufacturing method of the three-dimensional semiconductor memory device.

2. Related Art

A semiconductor memory device includes memory cells capable of storing data. A three-dimensional semiconductor memory device includes three-dimensionally arranged memory cells, so that an area occupied by memory cells per unit area of a substrate can be reduced.

In order to improve the degree of integration of the three-dimensional semiconductor memory device, a stacked number of memory cells may increase. The operational reliability of the three-dimensional semiconductor memory device may be deteriorated as the stacked number of memory cells increases.

SUMMARY

In accordance with an aspect of the present disclosure, there may be provided a semiconductor memory device including: a first stack structure including interlayer insulating layers and first conductive patterns, which are alternately stacked; a second stack structure including a second conductive pattern overlapping with the first stack structure, and a third conductive pattern overlapping with the first stack structure with the second conductive pattern interposed between the first stack and the third conductive pattern, the third conductive pattern having an oxidation rate different from that of the second conductive pattern; channel structures penetrating the first stack structure and the second stack structure; and a bit line overlapping with the first stack structure with the second stack structure interposed between the first stack structure and the bit line.

In accordance with another aspect of the present disclosure, there may be provided a semiconductor memory device including: a core insulating layer including a first part and a second part extending from the first part; a doped semiconductor pattern overlapping with the first part of the core insulating layer with the second part interposed between the first part and the doped semiconductor pattern; a first blocking insulating layer extending along a sidewall of the core insulating layer and a sidewall of the doped semiconductor pattern, the first blocking insulating layer protruding toward the second part of the core insulating layer; a channel layer extending between the first blocking insulating layer and the doped semiconductor pattern and between the first blocking insulating layer and the core insulating layer; a tunnel insulating layer disposed between the channel layer and the first blocking insulating layer; a data storage layer disposed between the tunnel insulating layer and the first blocking insulating layer; and a gate stack structure surrounding the first blocking insulating layer.

In accordance with still another aspect of the present disclosure, there may be provided a method of manufacturing a semiconductor memory device, the method including: forming a first stack structure including interlayer insulating layers and sacrificial layers, which are alternately stacked; forming a first conductive pattern overlapping the first stack structure; forming a second conductive pattern overlapping with the first stack structure with the first conductive pattern interposed between the first stack structure and the second conductive pattern; forming a hole penetrating the first stack structure, the first conductive pattern, and the second conductive pattern; forming a multi-layer on a sidewall of the hole, wherein the multi-layer includes a first part extending along a sidewall of the first stack structure, a second part extending along a sidewall of the first conductive pattern, and a third part extending along a sidewall of the second conductive pattern, and a width of the second part is wider than that of each of the first part and the third part; and forming a channel structure filling the hole on an inner wall of the multi-layer.

BRIEF DESCRIPTION OF THE DRAWINGS

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Specific structural or functional descriptions disclosed herein are merely illustrative for the purpose of describing embodiments according to the concept of the present disclosure. Embodiments according to the concept of the present disclosure can be implemented in various forms, and should not be construed as being limited to the specific embodiments set forth herein.

Hereinafter, the terms 'first' and 'second' are used to distinguish one component from another component. For example, a first component may be referred to as a second component without departing from a scope in accordance with the concept of the present disclosure and similarly, a second component may be referred to as a first component.

Embodiments provide a semiconductor memory device capable of improving operational reliability and a manufacturing method of the semiconductor memory device.

Figure 1:
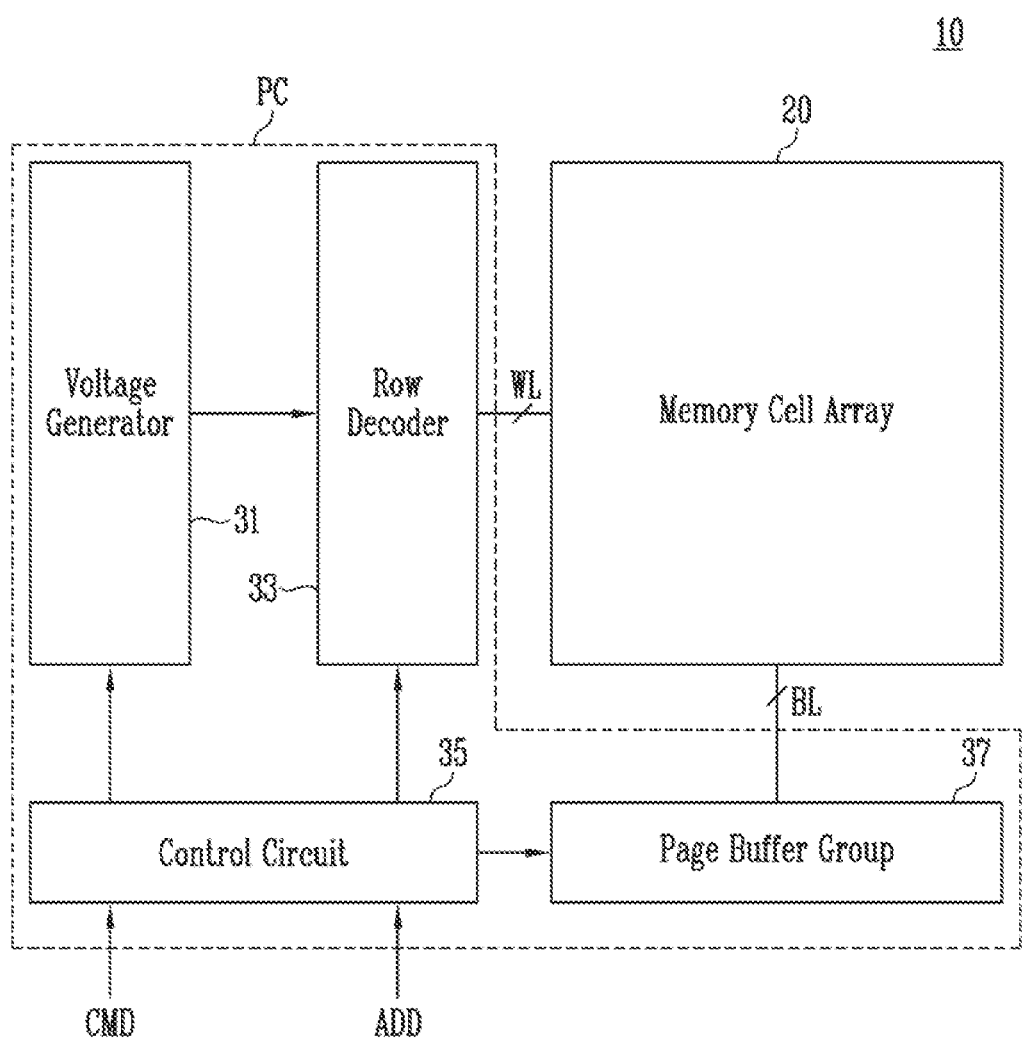
FIG. 1 is a block diagram illustrating a semiconductor memory device in accordance with an embodiment of the present disclosure.

FIG. 1 is a block diagram illustrating a semiconductor memory device 10 in accordance with an embodiment of the present disclosure.

Referring to FIG. 1, the semiconductor memory device 10 may include a peripheral circuit PC and a memory cell array 20.

The peripheral circuit PC may control a program operation for storing data in the memory cell array 20, a read operation for outputting data stored in the memory cell array 20, and an erase operation for erasing data stored in the memory cell array 20.

In an embodiment, the peripheral circuit PC may include a voltage generator 31, a row decoder 33, a control circuit 35, and a page buffer group 37.

The memory cell array 20 may include a plurality of memory blocks. The memory cell array 20 may be connected to the row decoder 33 through word lines WL, and be connected to the page buffer group 37 through bit lines BL.

The control circuit 35 may control the peripheral circuit PC in response to a command CMD and an address ADD.

The voltage generator 31 may generate various operation voltages, such as a pre-erase voltage, an erase voltage, a ground voltage, a program voltage, a verify voltage, a pass voltage, and a read voltage, which are used for a program operation, a read operation, and an erase operation, under the control of the control circuit 35.

The row decoder 33 may select a memory block under the control of the control logic 35. The row decoder 33 may apply operation voltages to word lines WL coupled to the selected memory block.

The page buffer group 37 may be connected to the memory cell array 20 through the bit lines BL. The page buffer group 37 may temporarily store data received from an input/output circuit (not shown) in a program operation under the control of the control circuit 35. The page buffer group 37 may sense a voltage or current of the bit lines BL in a read operation or verify operation under the control of the control circuit 37. The page buffer group 37 may select the bit lines BL under the control of the control circuit 35.

Structurally, the memory cell array 20 may overlap with a portion of the peripheral circuit PC.

Figure 2:
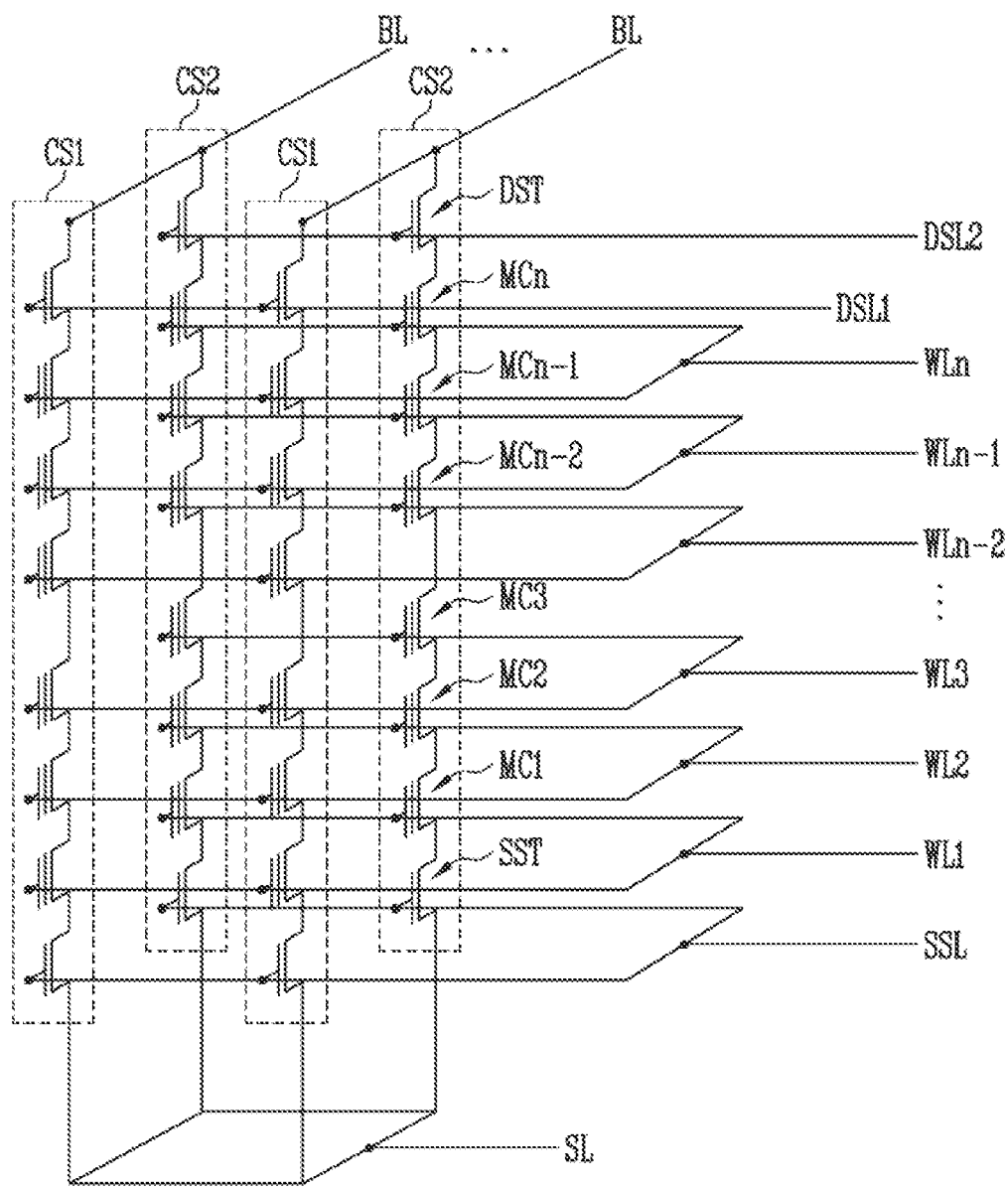
FIG. 2 is a circuit diagram illustrating a memory block in accordance with an embodiment of the present disclosure.

FIG. 2 is a circuit diagram illustrating a memory block in accordance with an embodiment of the present disclosure.

Referring to FIG. 2, the memory block may include a plurality of cell strings CS1 and CS2 commonly connected to a source layer SL and a plurality of word lines WL1 to WLn. The plurality of cell strings CS1 and CS2 may be connected to a plurality of bit lines BL.

Each of the plurality of cell strings CS1 and CS2 may include at least one source select transistor SST connected to the source layer SL, at least one drain select transistor DST connected to a bit line BL, and a plurality of memory cells MC1 to MCn connected in series between the source select transistor SST and the drain select transistor DST.

Gates of the plurality of memory cells MC1 to MCn may be respectively connected to the plurality of word lines WL1 to WLn stacked to be spaced apart from each other. The plurality of word lines WL1 to WLn may be disposed between a source select line SSL and two or more drain select lines DSL1 and DSL2. The two or more drain select lines DSL1 and DSL2 may be spaced apart from each other at the same level.

A gate of the source select transistor SST may be connected to the source select line SSL. A gate of the drain select transistor DST may be connected to a drain select line corresponding to the gate of the drain select transistor DST.

The source layer SL may be connected to a source of the source select transistor SST. A drain of the drain select transistor DST may be connected to a bit line corresponding to the drain of the drain select transistor DST.

The plurality of cell strings CS1 and CS2 may be divided into string groups respectively connected to the two or more drain select lines DSL1 and DSL2. Cell strings connected to the same word line and the same bit line may be independently controlled by different drain select lines. In addition, cell strings connected to the same drain select line may be independently controlled by different bit lines.

In an embodiment, the two or more drain select lines DSL1 and DSL2 may include a first drain select line DSL1 and a second drain select line DSL2. The plurality of cell strings CS1 and CS2 may include first cell strings CS1 of a first string group, which are connected to the first drain select line DSL1, and second cell strings CS2 of a second string group, which are connected to the second drain select line DSL2.

Figure 3A:
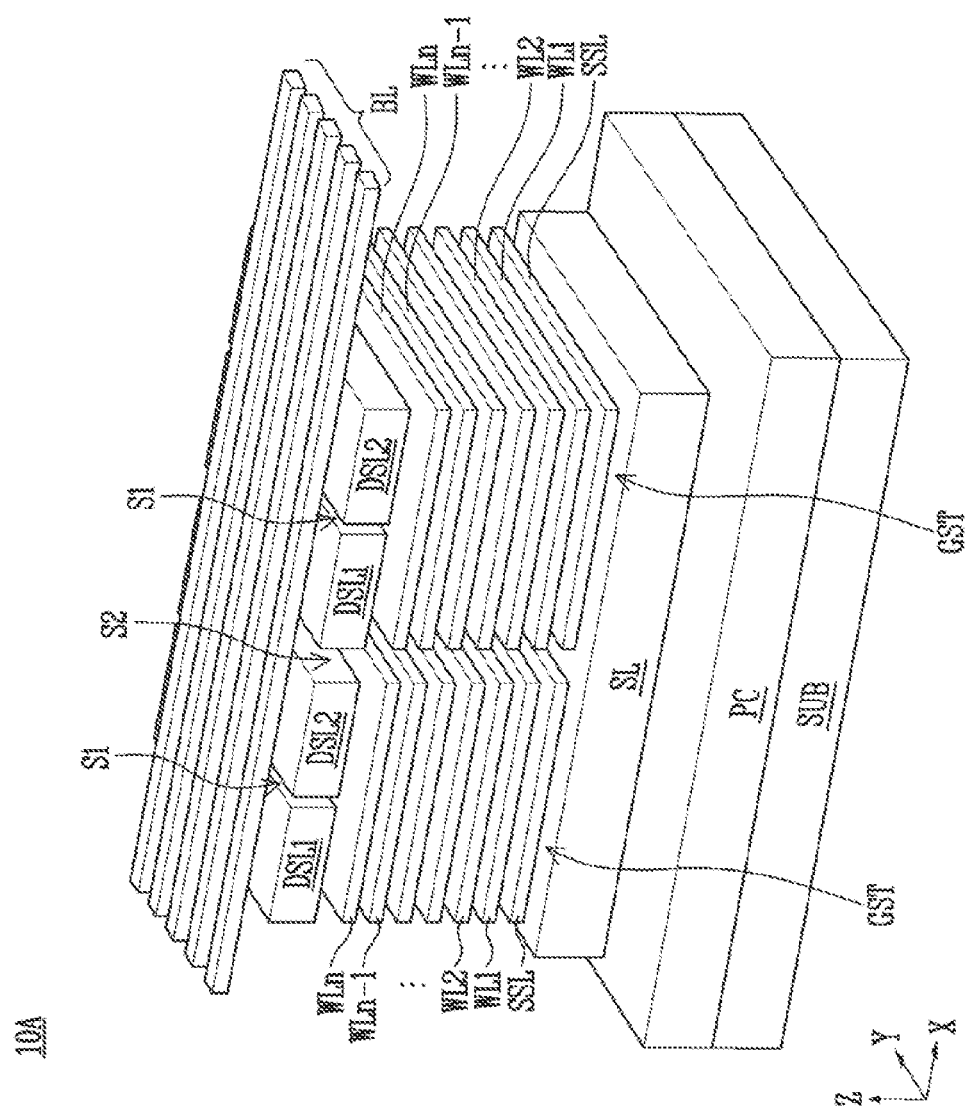
FIGS. 3A and 3B are perspective views schematically illustrating semiconductor memory devices in accordance with embodiments of the present disclosure.
Figure 3B:
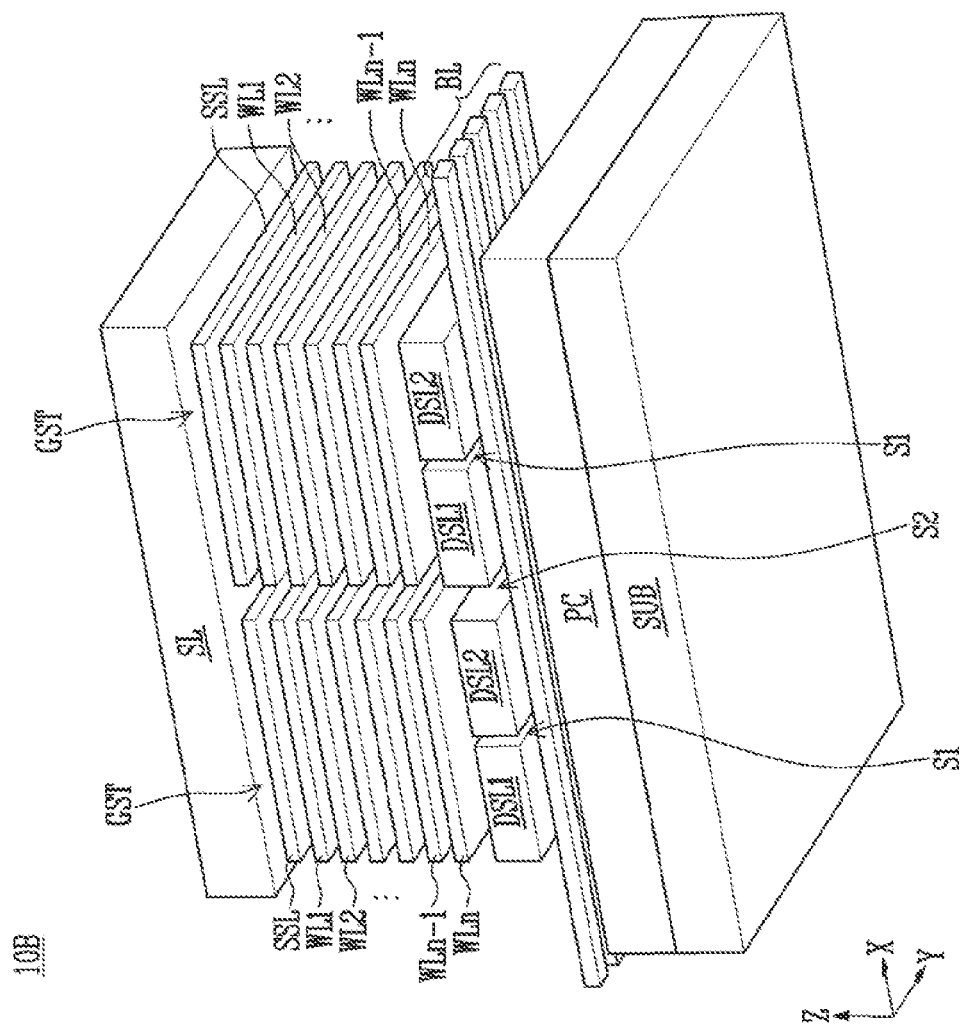

FIGS. 3A and 3B are perspective views schematically illustrating semiconductor memory devices 10A and 10B in accordance with embodiments of the present disclosure.

Referring to FIGS. 3A and 3B, each of the semiconductor memory devices 10A and 10B may include a peripheral circuit PC disposed on a substrate SUB and gate stack structures GST overlapping with the peripheral circuit PC.

Each of the gate stack structures GST may include a source select line SSL, a plurality of word lines WL1 to WLn, and two or more drain select lines DSL1 and DSL2 isolated from each other at the same level by a first slit S1.

The source select line SSL and the plurality of word lines WL1 to WLn may be formed in the shape of a plate which expands in a first direction X and a second direction Y and is parallel to a top surface of the substrate SUB. The first direction X may be a direction in which an X axis of an XYZ coordinate system faces, and the second direction Y may be a direction in which a Y axis of the XYZ coordinate system faces.

The plurality of word lines WL1 to WLn may be stacked to be spaced apart from each other in a third direction Z. The third direction Z may be a direction in which a Z axis of the XYZ coordinate system faces. The plurality of word lines WL1 to WLn may be disposed between the two or more drain select lines DSL1 and DSL2 and the source select line SSL.

The gate stack structures GST may be isolated from each other by a second slit S2. The first slit S1 may be formed shorter than the second slit S2 in the third direction Z, and overlap with the plurality of word lines WL1 to WLn.

Each of the first slit S1 and the second slit S2 may extend in a straight line shape, extend in a zigzag shape, or extend in a wave shape. A width of each of the first slit S1 and the second slit S2 may be variously changed according to a design rule.

Referring to FIG. 3A, in accordance with an embodiment, the source select line SSL may be disposed closer to the peripheral circuit PC than the two or more drain select lines DSL1 and DSL2.

The semiconductor memory device 10A may include a source layer SL disposed between the gate stack structures GST and the peripheral circuit PC and a plurality of bit lines BL further spaced apart from the peripheral circuit PC than the source layer SL. The gate stack structures GST may be disposed between the plurality of bit lines BL and the source layer SL.

Referring to FIG. 3B, in accordance with an embodiment, the two or more drain select lines DSL1 and DSL2 may be disposed closer to the peripheral circuit PC than the source select line SSL.

The semiconductor memory device 10B may include a plurality of bit lines BL and a source layer SL. The plurality of bit lines BL may be disposed between the gate stack structures GST and the peripheral circuit PC. The source layer SL may be further spaced apart from the peripheral circuit PC than the plurality of bit lines BL. The gate stack structures GST may be disposed between the plurality of bit lines BL and the source layer SL.

Referring back to FIGS. 3A and 3B, the plurality of bit lines BL may be formed of various conductive materials. The source layer SL may include a doped semiconductor layer. In an embodiment, the source layer SL may include an n-type doped silicon layer.

Although not shown in the drawings, the peripheral circuit PC may be electrically connected to the plurality of bit lines BL, the source layer SL, and the plurality of word lines WL1 to WLn through interconnections having various structures.

Figure 4:
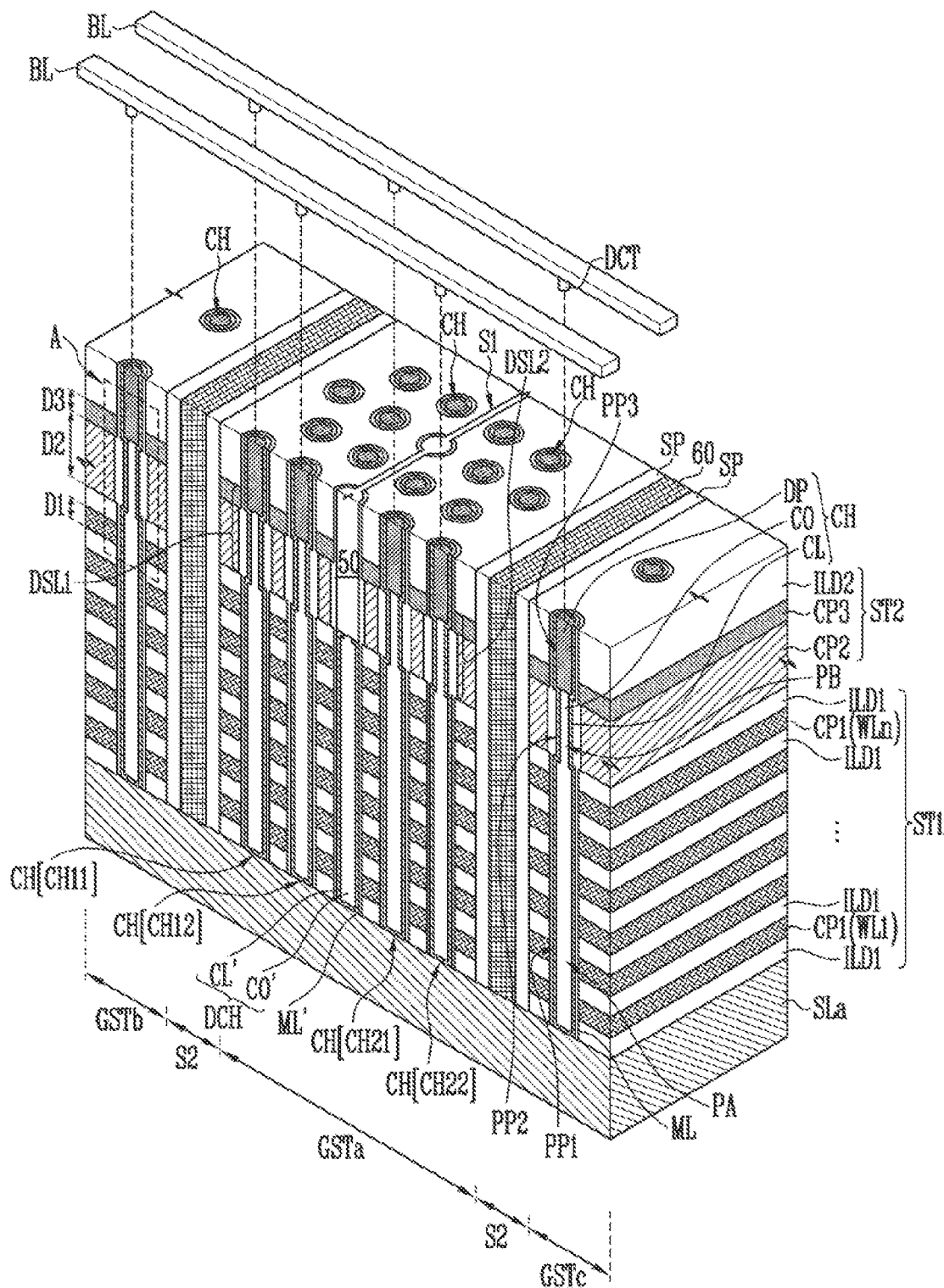
FIG. 4 is a perspective view illustrating gate stack structures of a semiconductor memory device in accordance with an embodiment of the present disclosure.

FIG. 4 is a perspective view illustrating gate stack structures GSTa, GSTb, and GSTc of a semiconductor memory device in accordance with an embodiment of the present disclosure.

Referring to FIG. 4, each of the gate stack structures GSTa, GSTb, and GSTc may include a first stack structure ST1 and a second stack structure ST2. The first stack structure ST1 and the second stack structure ST2 may be disposed between a plurality of bit line BL and a source layer SLa.

The plurality of bit lines BL may overlap with the first stack structure ST1, and the second stack structure ST2 may be disposed between the first stack structure ST1 and the plurality of bit lines BL. The plurality of bit lines BL may overlap with the source layer SLa.

The first stack structure ST1 may include first interlayer insulating layers ILD1 and first conductive patterns CP1, which are alternately stacked. The first conductive patterns CP1 may be used as source select line SSL and a plurality of word lines WL1 to WLn.

The second stack structure ST2 may include a second conductive pattern CP2, a third conductive pattern CP3, and a second interlayer insulating layer ILD2. The second conductive pattern CP2 may be disposed between the third conductive pattern CP3 and the first stack structure ST1, and overlap with the first stack structure ST1. The third conductive pattern CP3 may be disposed between the second conductive pattern CP2 and the second interlayer insulating layer ILD2, and overlap with the first stack structure ST1. The third conductive pattern CP3 may include a contact surface in contact with the second conductive pattern CP2. The third conductive pattern CP3 may include a conductive material having an oxidation rate different from that of the second conductive pattern CP2. In an embodiment, the second conductive pattern CP2 may include silicon, and the third conductive pattern CP3 may include a conductive material having a resistivity lower than that of silicon. In an embodiment, the third conductive pattern CP3 may include a metal silicide layer such as a tungsten silicide layer. RC delay of each of drain select lines DSL1 and DSL2 can be minimized through the third conductive pattern CP3 having a resistivity lower than that of the second conductive pattern CP2.

The second stack structure ST2 may be penetrated by a first slit S1. Each of the second conductive pattern CP2 and the third conductive pattern CP3 of the second stack structure ST2 may be isolated into the drain select lines DSL1 and DSL2 by the first slit S1. In an embodiment, each of the gate stack structures GSTa, GSTb, and GSTc may include a first drain select line DSL1 and second drain select line DSL2, which are isolated from each other by the first slit S1.

The gate stack structures GSTa, GSTb, and GSTc may be isolated from each other by second slits S2 formed deeper than the first slit S1. A spacer insulating layer SP may be formed on a sidewall of each of the second slits S2, and a vertical structure 60 may be formed in each of the second slits S2. In an embodiment, the vertical structure 60 may be in contact with the source layer SLa, and include a conductive material filling each of the second slits S2. However, the present disclosure is not limited thereto. In an embodiment, the vertical structure 60 may include insulating material.

The first stack structure ST1 and the second stack structure ST2 of each of the gate stack structures GSTa, GSTb, and GSTc may be penetrated by a plurality of channel structures CH. The plurality of channel structures CH may be arranged in a plurality of channel columns. The channel structures arranged in each channel column may include channel structures arranged in a line in a direction in which the bit lines BL extend. In an embodiment, the channel structures arranged in each channel column may include first channel structures CH11 and CH12 and second channel structures CH21 and CH22. The first channel structures CH11 and CH12 may be disposed at one side of the first slit S1, and the 15 second channel structures CH21 and CH22 may be disposed at the other side of the first slit S1. In other words, the first slit S1 may be disposed between the first channel structures CH11 and CH12 and the second channel structures CH21 and CH22.

In an embodiment, the first channel structures CH11 and CH12 may extend to penetrate the first drain select line DSL1 and the first stack structure ST1. The second channel structures CH21 and CH22 may extend penetrate the second drain select line DSL2 and the first stack structure ST1. Each of the first conductive patterns CP1 and the first interlayer insulating layers ILD1 may extend to surround the first channel structures CH11 and CH12 and the second channel structures CH21 and CH22.

Each of the bit lines may be electrically connected to any one of the first channel structures CH11 and CH12 and any one of the second channel structures CH21 and CH22 via drain contact plugs DCT.

A dummy channel structure DCH may be disposed between the first channel structures CH11 and CH12 and the second channel structures CH21 and CH22. The dummy channel structure DCH may penetrate the first stack structure ST1. The first slit S1 may overlap with the dummy channel structure DCH.

Each of the channel structures CH may include a core insulating layer CO, a doped semiconductor pattern DP, and a channel layer CL. The dummy channel structure DCH may include a dummy core insulating layer CO' and a dummy channel layer CL'.

The core insulating layer CO may be surrounded by the first stack structure ST1 and the second conductive pattern CP2. In an embodiment, the core insulating layer CO may include a first part PA surround by the first stack structure ST1 and a second part PB which extends from the first part PA and is surrounded by the second conductive pattern CP2. The dummy core insulating layer CO' may extend in parallel to the first part PA of the core insulating layer CO.

The doped semiconductor pattern DP may overlap with the core insulating layer CO, and be surrounded by the third conductive pattern CP3 and the second interlayer insulating layer ILD2. In an embodiment, the doped semiconductor pattern DP may overlap with the first part PA of the core insulating layer CO with the second part PB of the core insulating layer CO, which is interposed therebetween. In an embodiment, the doped semiconductor pattern DP may include an n-type doped silicon layer.

The doped semiconductor pattern DP may be surrounded by at least a portion of the third conductive pattern CP3, and therefore, a Gate Induced Drain Leakage (GIDL) current may be increased during an erase operation of the semiconductor memory device. The GIDL current may be generated by a difference between an erase voltage applied to the bit line BL and a gate voltage applied to the third conductive pattern CP3.

A distance between the doped semiconductor pattern DP and a word line WLn closest to the doped semiconductor pattern DP among the plurality of word lines WL1 to WLn may be controlled by adjusting a thickness D2 of the second conductive pattern CP2. The second conductive pattern CP2 may be formed thick, to improve off characteristics of drain select transistors connected to the first and second drain select lines DSL1 and DSL2. In an embodiment, the thickness D2 of the second conductive pattern CP2 may be formed thicker than the thickness D1 of each of the first conductive patterns CP1 and that D3 of the third conductive pattern CP3. In an embodiment, the thickness D2 of the second conductive pattern CP2 may be two or more times of the thickness D1 of each of the first conductive patterns CP1.

The channel layer CL may extend along a sidewall of the core insulating layer CO and a sidewall of the doped semiconductor pattern DP. The channel layer CL may include a first part PP1, a second part PP2 extending from the first part PP1, and a third part PP3 extending from the second part PP2. The first part PP1 may be disposed between the first stack structure ST1 and the core insulating layer CO. The first part PP1 may extend between the source layer SLa and the core insulating layer CO, and be in contact with the source layer SLa. The second part PP2 may be disposed between the second conductive pattern CP2 and the core insulating layer CO. The third part PP3 may surround the sidewall of the doped semiconductor pattern DP. The dummy channel layer CL' may extend in parallel to the first part PP1 of the channel layer CL. Each of the channel layer CL and the dummy channel layer CL' may include a semiconductor layer. In an embodiment, each of the channel layer CL and the dummy channel layer CL' may include silicon layer.

A sidewall of each of the channel structures CH may be surrounded by a memory layer ML. A sidewall of the dummy channel structure DCH may be surrounded by a dummy memory layer ML'. The dummy memory layer ML' may extend to penetrate the second stack structure ST2 from the sidewall of the dummy channel structure DCH. The dummy memory layer ML' may extend onto a sidewall of an isolation insulating layer 50. The isolation insulating layer 50 may be disposed between the first drain select line DSL1 and the second drain select line DSL2. The isolation insulating layer 50 may fill the first slit S1, and overlap with the dummy channel structure DCH. The dummy memory layer ML' may include the same material layers as the memory layer ML.

Although not shown in the drawing, an upper insulating layer penetrated by the drain contact plug DCT may be disposed between the plurality of bit lines BL and the second stack structure ST2.

Figure 5:
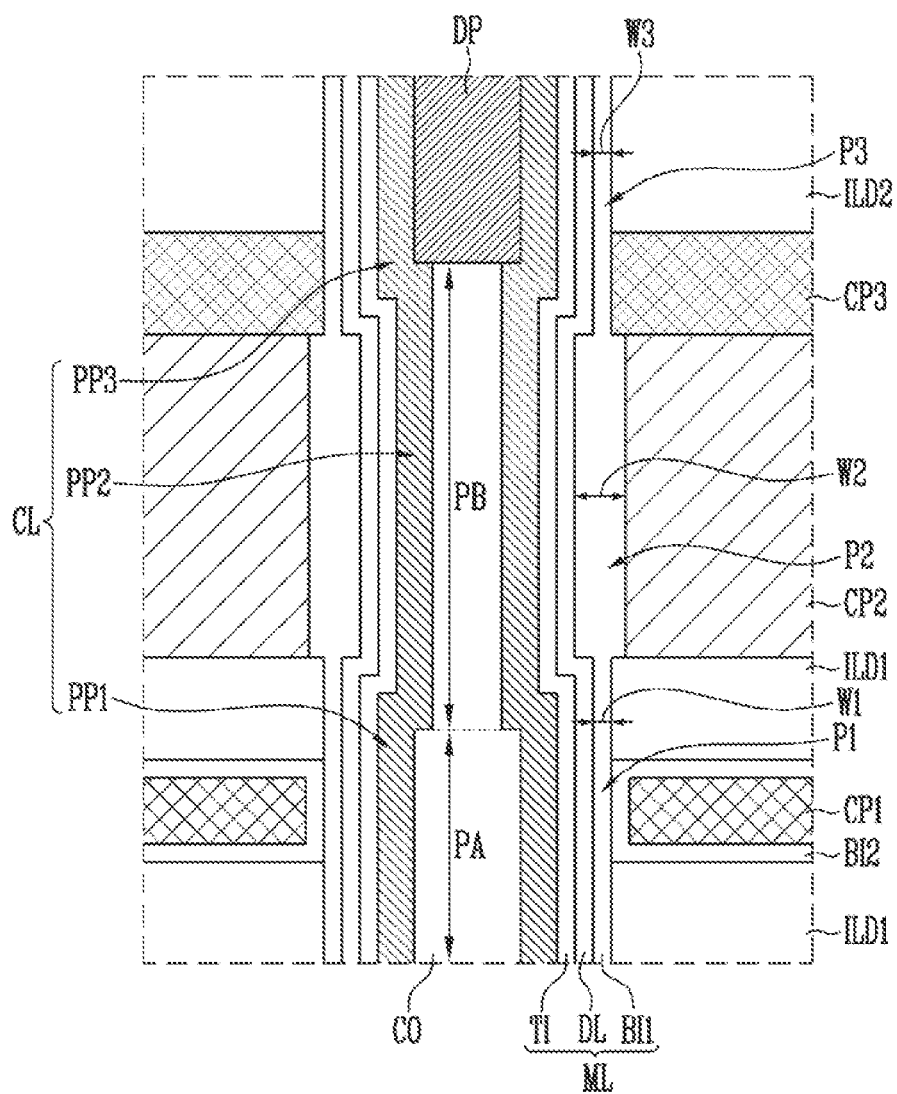
FIG. 5 is an enlarged sectional view of region A shown in FIG. 4.

FIG. 5 is an enlarged sectional view of region A shown in FIG. 4.

Referring to FIG. 5, the memory layer ML may include a tunnel insulating layer TI, a data storage layer DL, and a first blocking insulating layer BI1.

The tunnel insulating layer TI may surround the sidewall of each of the channel structures CH shown in FIG. 4. The tunnel insulating layer TI may include an insulating material through which charges can tunnel. In an embodiment, the tunnel insulating layer TI may include a silicon oxide layer.

The data storage layer DL may surround a sidewall of the tunnel insulating layer TI. The data storage layer DL may include a material layer capable of storing data. In an embodiment, the data storage layer DL may be formed of a material layer capable of storing data changed by using Fowler-Nordheim (F-N) tunneling. To this end, the data storage layer DL may include a nitride layer in which charges can be trapped. However, the present disclosure is not limited thereto, and the data storage layer DL may include a phase change material, nano dots, etc.

The first blocking insulating layer BI1 may surround a sidewall of the data storage layer DL. The first blocking insulating layer BI1 may extend along the sidewall of the core insulating layer CO and the sidewall of the doped semiconductor pattern DP. The first blocking insulating layer BI1 may include a first part P1, a second part P2, and a third part P3. The first part P1 is disposed between the data storage layer DL and the first stack structure ST1 shown in FIG. 4. The second part P2 extends from the first part P1, and is disposed between the data storage layer DL and the second conductive pattern CP2. The third part P3 extends from the second part P2, and is disposed between the data storage layer DL and the third conductive pattern CP3.

The first blocking insulating layer BI1 may include oxide. A width W2 of the second part P2 of the first blocking insulating layer BI1 may be formed wider than each of a width W1 of the first part P1 and a width W3 of the third part P3. The second part P2 may further protrude toward the channel layer CL of the channel structure than the first part P1 and the third part P3. In an embodiment, the first blocking insulating layer BI1 may protrude toward the second part PB of the core insulating layer CO between the doped semiconductor pattern DP and the first part PA of the core insulating layer CO. The second part P2 may protrude toward the second conductive pattern CP2 between the third conductive pattern CP3 and the first stack structure ST1 shown in FIG. 4.

An uneven surface may be defined at an inner wall of the first blocking insulating layer BI1, which is in contact with the data storage layer DL, by the protruding second part P2 of the first blocking insulating layer BI1. Each of the data storage layer DL disposed between the first blocking layer BI1 and the channel layer CL and the tunnel insulating layer TI disposed between the data storage layer DL and the channel layer CL may be deposited along the uneven surface of the first blocking insulating layer BI1.

The channel layer CL may extend between the first blocking insulating layer BI1 and the doped semiconductor pattern DP and between the first blocking insulating layer BI1 and the core insulating layer CO. The second part PP2 of the channel layer CL may be formed along the uneven surface of the first blocking insulating layer BI1 to further protrude toward the core insulating layer CO than the first part PP1 and the third part PP3.

The doped semiconductor pattern DP may be aligned on the protruding second part PP2 of the channel layer CL. Accordingly, in an embodiment of the present disclosure, a variation may be reduced, in which the position of the doped semiconductor pattern DP is out of a target range.

The first conductive pattern CP1 may surround the memory layer ML between the first interlayer insulating layers ILD1. The first conductive pattern CP1 may include a conductive material having a resistivity lower than that of silicon. In an embodiment, the first conductive pattern CP1 may include a metal layer.

A second blocking insulating layer BI2 may be further formed between the first conductive pattern CP1 and the first blocking insulating layer BI1. The second blocking insulating layer BI2 may include an insulating material having a dielectric constant higher than that of the first blocking insulating layer BI1. In an embodiment, the second blocking insulating layer BI2 may include a metal oxide layer. In an embodiment, the metal oxide layer may include aluminum oxide layer. The second blocking insulating layer BI2 may extend along an interface between the first conductive pattern CP1 and the first interlayer insulating layers ILD1.

The second conductive pattern CP2 and the third conductive pattern CP3 may be in contact with the first blocking insulating layer BI1. In other words, the second blocking insulating layer BI2 may be omitted between the channel layer CL and the drain select line including the second conductive pattern CP2 and the third conductive pattern CP3.

The semiconductor memory device shown in FIGS. 4 and 5 may be applied to the semiconductor memory device 10A shown in FIG. 3A. The semiconductor memory device shown in FIGS. 4 and 5 may be vertically reversed, to be applied to the semiconductor memory device 10B shown in FIG. 3B.

The channel layer CL may penetrate the memory layer ML and include a bottom surface in contact with the source layer SLa as shown in FIG. 4. However, the embodiments of the present disclosure is not limited thereto.

Figure 6:
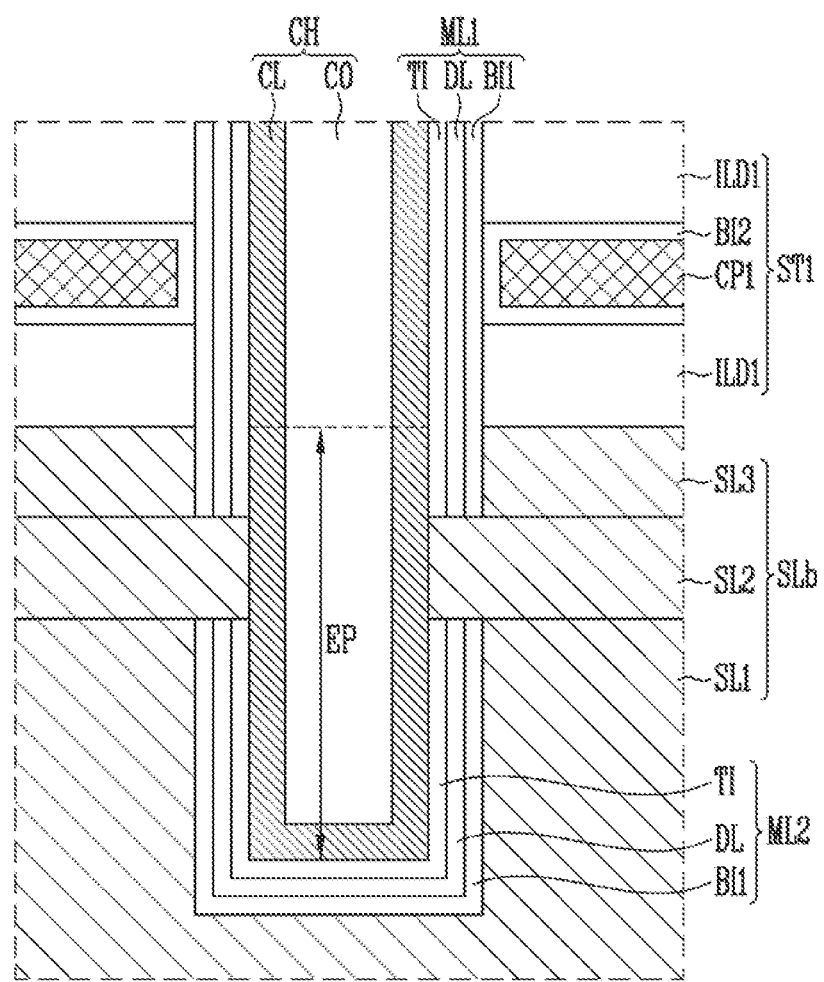
FIG. 6 is a sectional view illustrating a source layer and a channel structure in accordance with an embodiment of the present disclosure.

FIG. 6 is a sectional view illustrating a source layer SLb and the channel structure CH in accordance with an embodiment of the present disclosure. A structure shown in FIG. 6 may be applied to the semiconductor memory device 10A shown in FIG. 3A.

Referring to FIG. 6, the source layer SLb may include a first layer SL1 (i.e., first source layer) and a second layer SL2 (i.e., second source layer), or include a first layer SL1, a second layer SL2, and a third layer SL3 (i.e., third source layer). The first layer SL1 may overlap with the first stack structure ST1. The second layer SL2 may be disposed between the first stack structure ST1 and a first layer SL1. The third layer SL3 may be disposed between the second layer SL2 and the first stack structure ST1.

Each of the first layer SL1, the second layer SL2, and the third layer SL3 may include a semiconductor layer. Each of the first layer SL1, the second layer SL2, and the third layer SL3 may included at least one of a p-type impurity and an n-type impurity. In an embodiment, each of the first layer SL1, the second layer SL2, and the third layer SL3 may include an n-type doped silicon layer.

The first stack structure ST1 may include the first interlayer insulating layers ILD and the first conductive patterns CP1, which are alternately stacked as described with reference to FIG. 4, and be penetrated by the channel structure CH.

An end portion EP of the channel structure CH may penetrate the third layer SL3 and the second layer SL2, and extend to the inside of the first layer SL1. In an embodiment, the channel layer CL and the core insulating layer CO may penetrate the third layer SL3 and the second layer SL2, and extend to the inside of the first layer SL1.

Each of the first blocking insulating layer BI1, the data storage layer DL, and the tunnel insulating layer TI may be isolated into a first memory pattern ML1 and a second memory pattern ML2. The second layer SL2 may further protrude toward the channel layer CL than the first layer SL1 and the third layer SL3, and be in contact with the channel layer CL.

The first blocking insulating layer BI1, the data storage layer DL, and the tunnel insulating layer TI of the first memory pattern ML1 may extend between the third layer SL3 and the channel layer CL and between the first stack structure ST1 and the channel layer CL. The first blocking insulating layer BI1, the data storage layer DL, and the tunnel insulating layer TI of the second memory pattern ML2 may extend between the first layer SL1 and the channel layer CL.

The second blocking insulating layer BI2 may be disposed between the first blocking insulating layer BI1 of the first memory pattern ML1 and the first conductive pattern CP1.

Figure 7:
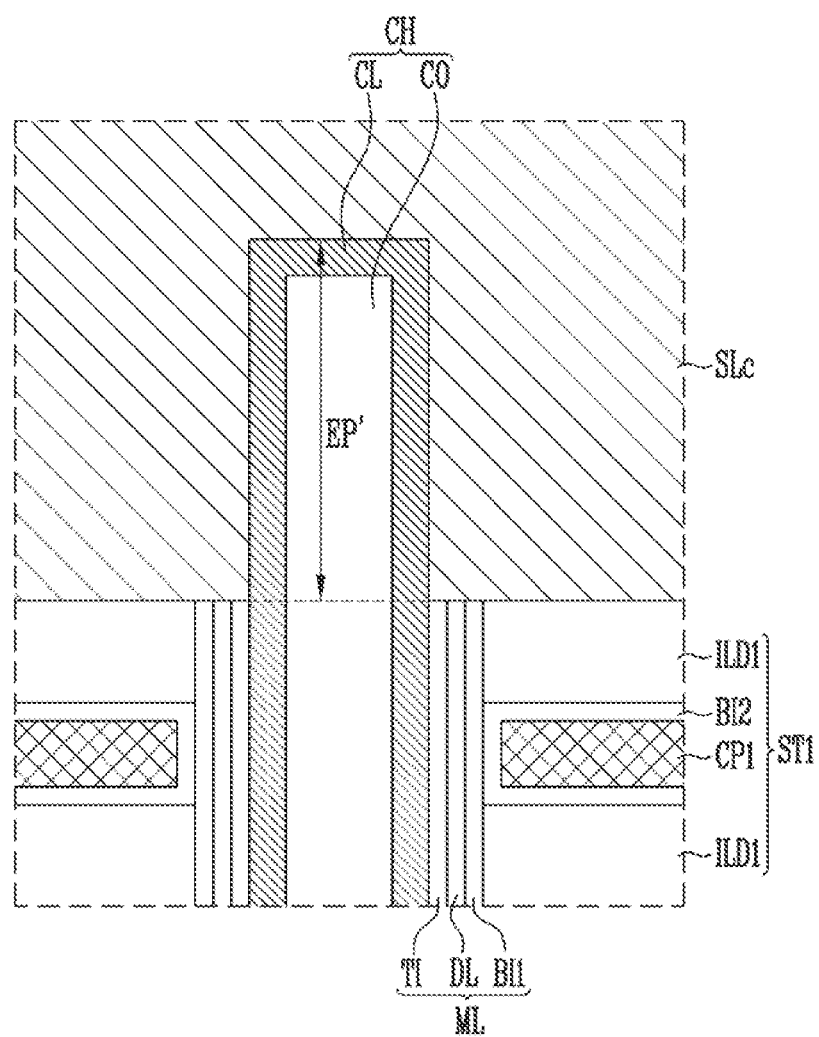
FIG. 7 is a sectional view illustrating a source layer and the channel structure in accordance with an embodiment of the present disclosure.

FIG. 7 is a sectional view illustrating a source layer SLc and the channel structure CH in accordance with an embodiment of the present disclosure. A structure shown in FIG. 7 may be applied to the semiconductor memory device 10B shown in FIG. 3B.

Referring to FIG. 7, the source layer SLc may overlap with the first stack structure ST1, and include a doped semiconductor layer. In an embodiment, the source layer SLc may include n-type doped silicon. The first stack structure ST1 may be disposed between the source layer SLc and the second stack structure ST2 described with reference to FIG. 4.

The first stack structure ST1 may include the first interlayer insulating layers ILD and the first conductive patterns CP1, which are alternately stacked as described with reference to FIG. 4, and be penetrated by the channel structure CH.

An end portion EP' of the channel structure CH may penetrate the first blocking insulating layer BI1, the data storage layer DL, and the tunnel insulating layer TI of the memory layer ML, and extend to the inside of the source layer SLc. In an embodiment, the channel layer CL and the core insulating layer CO may extend to the inside of the source layer SLc. A portion of the channel layer CL, which constitute the end portion EP' of the channel structure CH, may be in contact with the source layer SLc.

Figure 8:
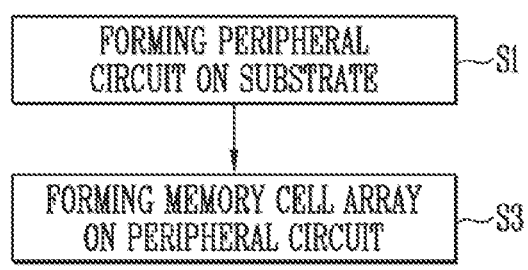
FIG. 8 is a flowchart schematically illustrating a manufacturing method of a semiconductor memory device in accordance with an embodiment of the present disclosure.

FIG. 8 is a flowchart schematically illustrating a manufacturing method of a semiconductor memory device in accordance with an embodiment of the present disclosure.

Referring to FIG. 8, the manufacturing method of the semiconductor memory device may include step S1 of forming a peripheral circuit on a substrate and step S3 of forming a memory cell array on the peripheral circuit.

In the step S1, the peripheral circuit may be provided on the substrate. The peripheral circuit may include a plurality of transistors. Junctions of the transistors may be formed in a partial region of the substrate, and gate electrodes of the transistors may be formed on the substrate.

In the step S3, the memory cell array may be formed on the peripheral circuit. The step S3 may include step of forming the source layer SL shown in FIG. 3A, step of forming the gate stack structures GST shown in FIG. 3A, and step of forming the bit lines BL shown in FIG. 3A.

Although not shown in the drawing, before the step S3, conductive patterns for interconnections may be formed on the peripheral circuit, and the memory cell array may be formed on the interconnections.

Figure 9:
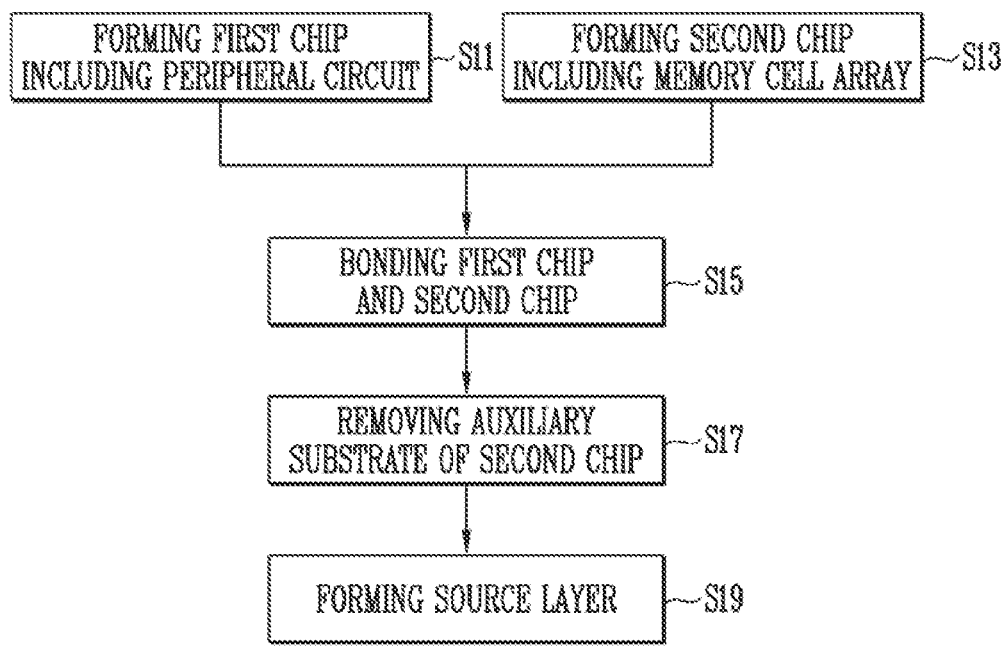
FIG. 9 is a flowchart schematically illustrating a manufacturing method of a semiconductor memory device in accordance with an embodiment of the present disclosure.

FIG. 9 is a flowchart schematically illustrating a manufacturing method of a semiconductor memory device in accordance with an embodiment of the present disclosure.

Referring to FIG. 9, the manufacturing method of the semiconductor memory device may include step S11 of forming a first chip including a peripheral circuit, step S13 of forming a second chip including a memory cell array, step S15 of bonding the first chip and the second chip, step S17 of removing an auxiliary substrate of the second chip, and step S19 of forming a source layer.

In the step S11, the peripheral circuit may be provided on a main substrate. The first chip may include first interconnections connected to the peripheral circuit.

In the step S13, the memory cell array may be formed on the auxiliary substrate. The step S13 may include step of forming the gate stack structures GST shown in FIG. 3B and step of forming the bit lines BL shown in FIG. 3B. A structure including the gate stack structures GST and the bit lines BL, which are shown in FIG. 3B, may be vertically reversed, to be formed on the auxiliary substrate. The second chip may further include second interconnections connected to the memory cell array.

In the step S15, the second chip may be aligned on the first chip such that the first interconnections and the second interconnections face each other, and some of the first interconnections and some of the second interconnections may be bonded to each other.

In the step S17, the auxiliary substrate of the second chip may be removed. Channel structures of the memory cell array may be exposed.

In the step S19, the source layer in contact with the channel structures may be formed. Accordingly, the semiconductor memory device 10B shown in FIG. 3B may be provided.

FIGS. 10A, 10B, 10C, 10D, 11A, 11B, 11C, 11D, 12A, 12B, 12C, and 12D are sectional views illustrating a manufacturing method of a memory cell array in accordance with an embodiment of the present disclosure. The manufacturing method of the memory cell array, which will be described later with reference to FIGS. 10A, 10B, 10C, 10D, 11A, 11B, 11C, 11D, 12A, 12B, 12C, and 12D may be included in the step S3 shown in FIG. 8 or be included in the step S13 shown in FIG. 9.

FIGS. 10A to 10D are sectional views illustrating step of forming a preliminary stack structure 110 and step of forming channel structures 140A which penetrate the preliminary stack structure 110 and are respectively surrounded by memory layers 130A.

Figure 10A:
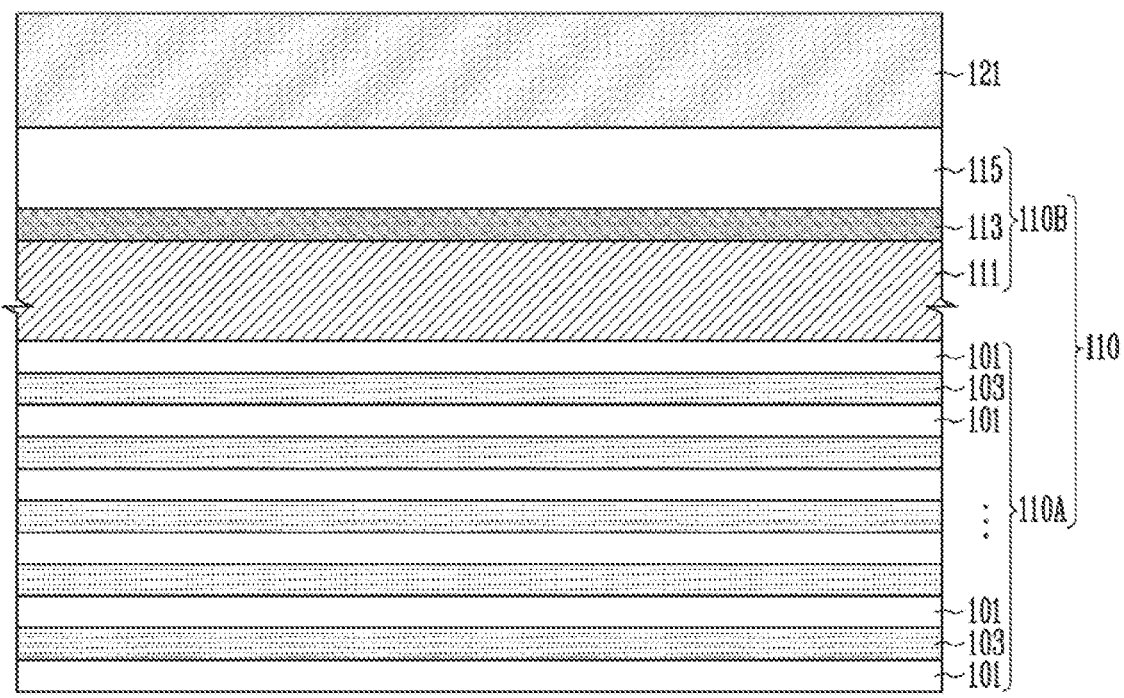
FIGS. 10A, 10B, 10C, 10D, 11A, 11B, 11C, 11D, 12A, 12B, 12C, and 12D are sectional views illustrating a manufacturing method of a memory cell array in accordance with an embodiment of the present disclosure.

Referring to FIG. 10A, the step of forming the preliminary stack structure 110 may include step of forming a first stack structure 110A and step of forming a second stack structure 110B on the first stack structure 110A.

The step of forming the first stack structure 110A may include step of alternately stacking first interlayer insulating layers 101 and sacrificial layers 103. Each of the sacrificial layers 103 may include a material having an etch selectivity with respect to the first interlayer insulating layers 101. In an embodiment, the first interlayer insulating layers 101 may include silicon oxide, and the sacrificial layers 103 may include silicon nitride.

The step of forming the second stack structure 110B may include step of sequentially stacking a first conductive pattern 111, a second conductive pattern 113, and a second interlayer insulating layer 115. Each of the first conductive pattern 111, the second conductive pattern 113, and the second interlayer insulating layer 115 may overlap with the first stack structure 110A. The first conductive pattern 111 may be disposed between the second conductive pattern 113 and the first stack structure 110A, and the second conductive pattern 113 may be disposed between the second interlayer insulating layer 115 and the first conductive pattern 111.

The second conductive pattern 113 may include a conductive material having an oxidation rate lower than that of the first conductive pattern 111. In an embodiment, the first conductive pattern 111 may include silicon, and the second conductive pattern 113 may include a conductive pattern having a resistivity lower than that of silicon. In an embodiment, the second conductive pattern 113 may include a metal silicide layer such as a tungsten silicide layer.

The first conductive pattern 111 may be formed thicker than each of the sacrificial layers 103. A thickness of the second conductive pattern 113 may be variously controlled. In an embodiment, the second conductive pattern 113 may be formed thinner than the first conductive pattern 111.

After the preliminary stack structure 110 is formed, a mask layer 121 may be formed on the preliminary stack structure 110. The mask layer 121 may include a nitride layer.

Figure 10B:
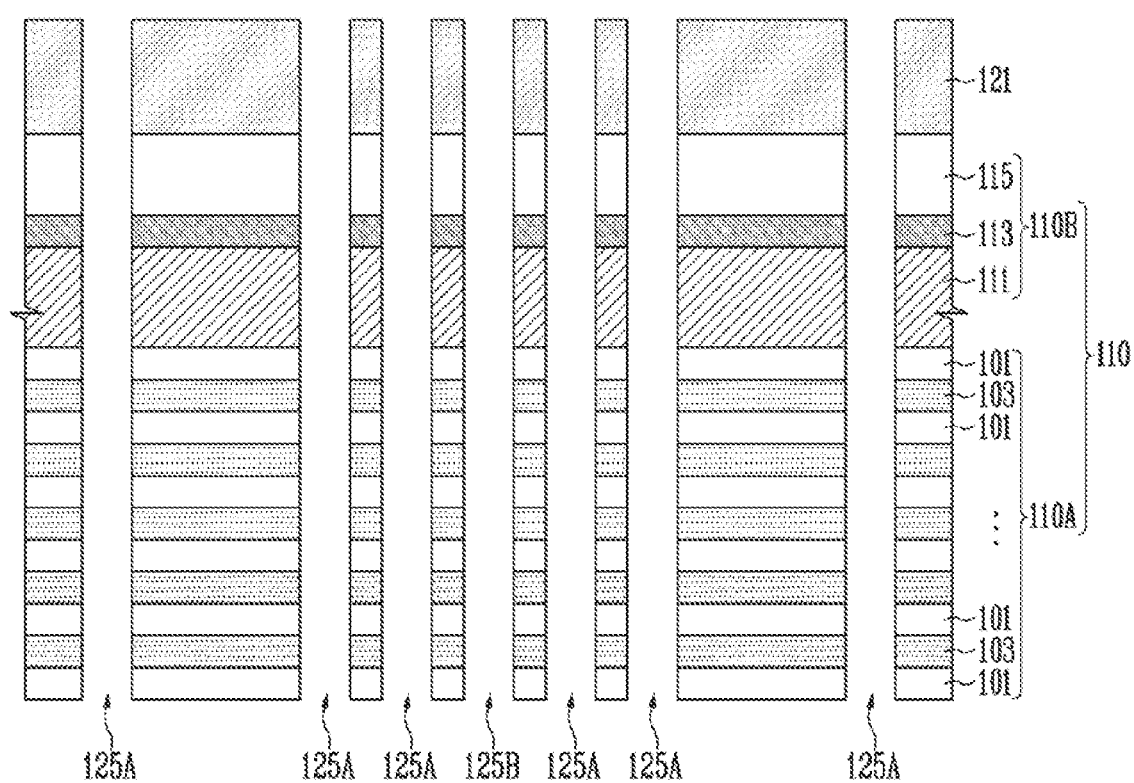

Referring to FIG. 10B, holes 125A may be formed by etching the mask layer 121 and the preliminary stack structure 110. The holes 125A may penetrate the preliminary stack structure 110. In the step of forming the holes 125A, a dummy hole 125B penetrating the preliminary stack structure 110 may be simultaneously formed with the holes 125A.

The holes 125A and the dummy hole 125B may be defined by etching the mask layer 121 and the preliminary stack structure 110. The mask layer 121 and the preliminary stack structure 110 may be etched by using a photoresist pattern (not shown) as an etch barrier. The photoresist pattern may be formed through a photolithography process.

After the holes 125A and the dummy hole 125B are formed, the photoresist pattern may be removed.

Figure 10C:
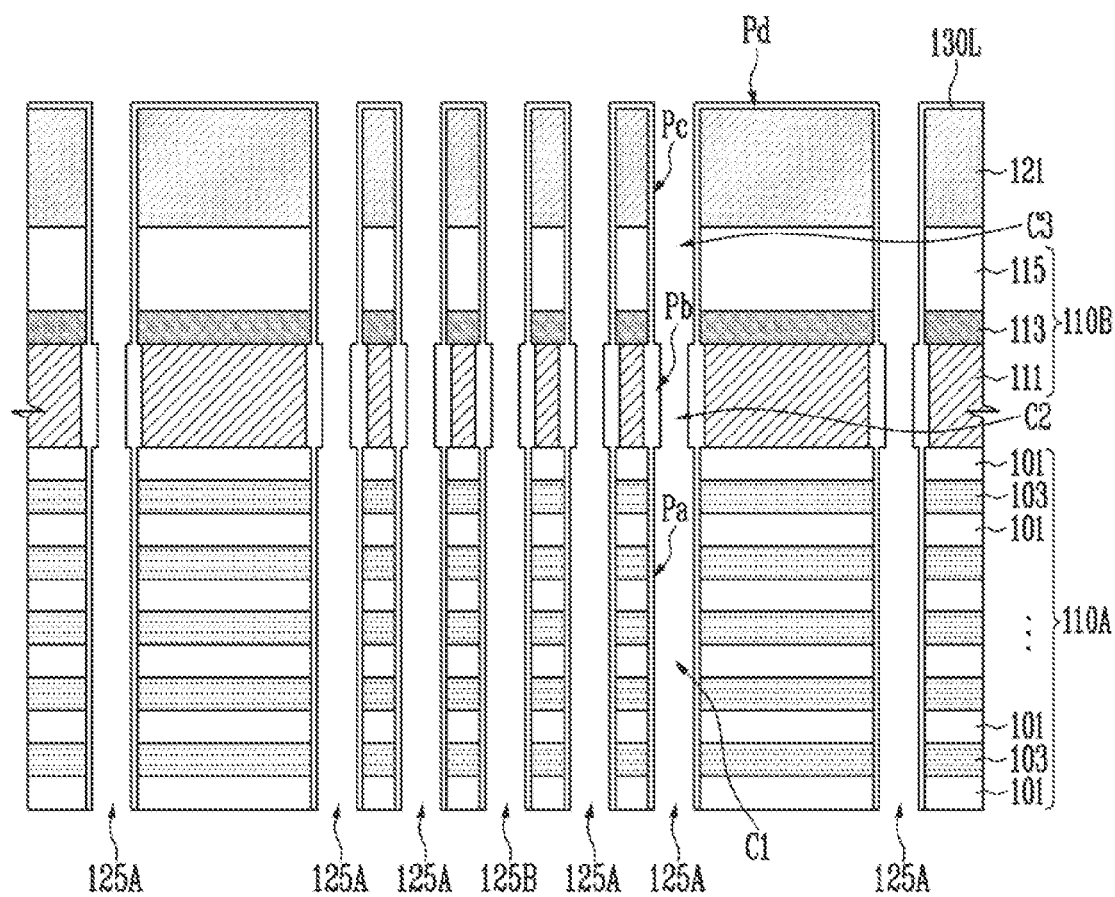

Referring to FIG. 10C, a multi-layer 130L may be formed to cover surfaces of the holes 125A and the dummy hole 125B. The multi-layer 130L may extend onto the mask layer 121. The multi-layer 130L may include a first blocking insulating layer 133, a data storage layer 135, and a tunnel insulating layer 137, which are shown in FIG. 11C.

The multi-layer 130L may include a first part Pa, a second part Pb, a third part Pc, and a fourth part Pd. The first part Pa, the second part Pb, and the third part Pc of the multi-layer 130L may be disposed on a sidewall of each of the holes 125A and the dummy hole 125B. The first part Pa may extend along a sidewall of the first stack structure 110A. The second part Pb may extend from the first part Pa, and extend along a sidewall of the first conductive pattern 111. The third part Pc may extend from the second part Pb, and extend along a sidewall of the second conductive pattern 113, a sidewall of the second interlayer insulating layer 115, and a sidewall of the mask layer 121. The fourth part Pd may extend from the third part Pc, and extend along a top surface of the mask layer 121. The second part Pb of the multi-layer 130L may be formed to have a width wider than the widths of the other parts Pa, Pc, and Pd.

A central region of each of the holes 125A and the dummy hole 125B may include a first central region C1 surrounded by the first part Pa, a second central region C2 surrounded by the second part Pb, and a third central region C3 surrounded by the third part Pc. The second part Pb may further protrude toward the second central region C2 than the first part Pa and the third part Pc such that an inner wall of the multi-layer 130L, which faces the central region of each of the holes 125A and the dummy hole 125B, has an uneven surface.

Figure 11A:
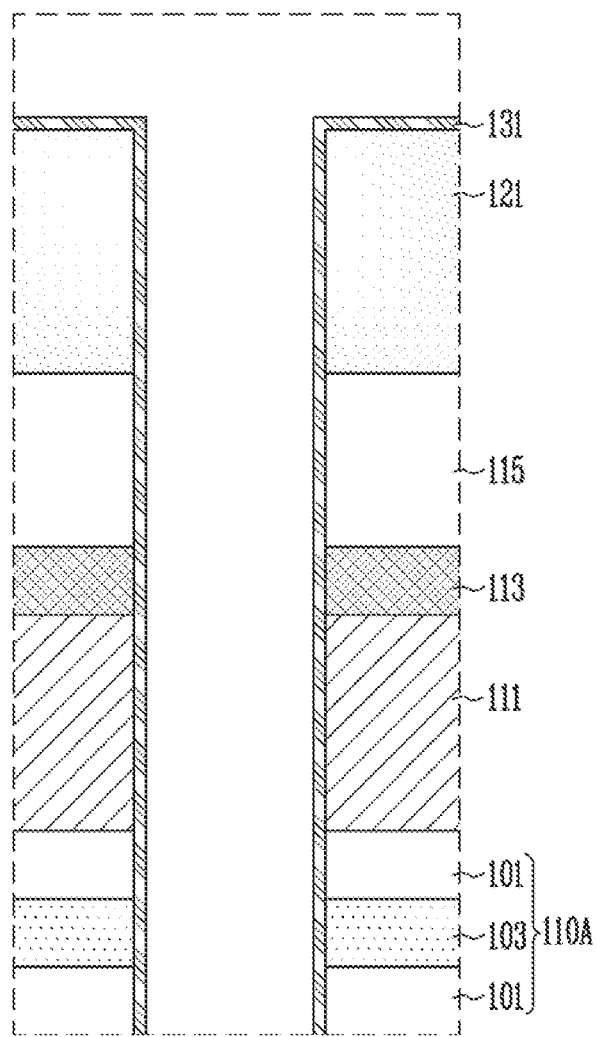
Figure 11B:
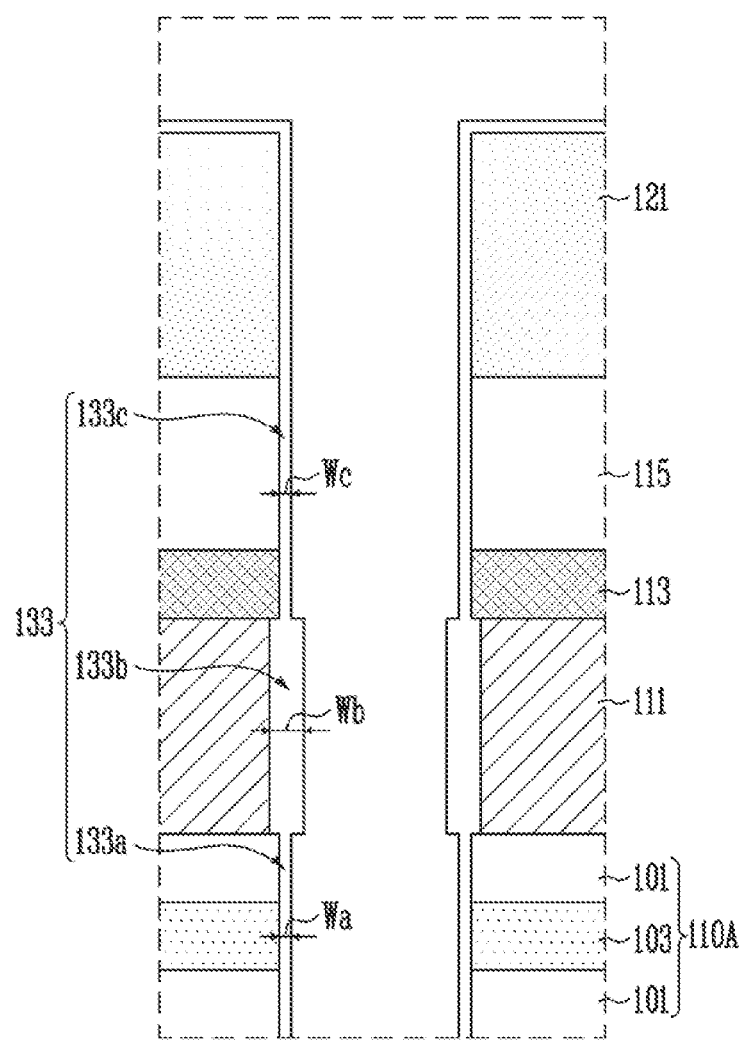
Figure 11C:
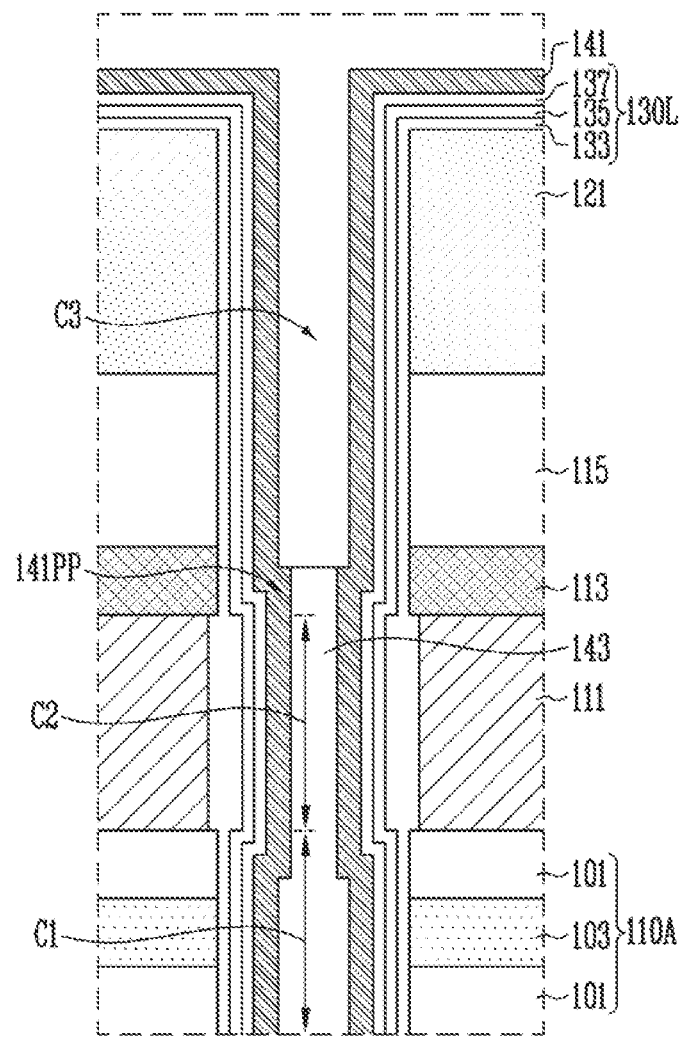

FIGS. 11A to 11D are enlarged sectional views. FIGS. 11A to 11C illustrate an embodiment of the step of forming the multi-layer 130L.

Referring to FIG. 11A, the step of forming the multi-layer 130L shown in FIG. 10C may include step of forming a liner layer 131 on the surface of each of the holes 125A and the dummy hole 125B, which are shown in FIG. 10B. The liner layer 131 may be formed using deposition having good step coverage. In an embodiment, the liner layer 131 may be formed using atomic layer deposition (ALD). The liner layer 131 may include a material having an oxidation rate lower than that of the first conductive pattern 111. In an embodiment, the liner layer 131 may include a nitride layer.

Referring to FIG. 11B, the step of forming the multi-layer 130L shown in FIG. 10C may include step of forming the blocking insulating layer 133 by oxidizing the liner layer 131 and the first conductive pattern 111, which are shown in FIG. 11A, through an oxidation process.

During the oxidation process, a portion of the first conductive pattern 111 may be oxidized. The oxidation process may include a radical oxidation process in which an oxidation rate of the first conductive pattern 111 is higher than the oxidation rates of the liner layer 131 and the second conductive pattern 113, which are shown in FIG. 11A. An inner wall of the blocking insulating layer 133 defined by the oxidation process in accordance with the embodiment of the present disclosure may have an uneven surface. The blocking insulating layer 133 may include an oxidation region of the liner layer 131 shown in FIG. 11B and a region in which a portion of the first conductive pattern 111 is oxidized.

The blocking insulating layer 133 may include a first part 133a, a second part 133b extending from the first part 133a, and a third part 133c extending from the second part 133b. The first part 133a may extend along the sidewall of the first stack structure 110A, the second part 133b may extend along the sidewall of the first conductive pattern 111, and the third part 133C may extend along the sidewall of the second conductive pattern 113, the sidewall of the second interlayer insulating layer 115, and a surface of the mask layer 121.

Due to a difference in oxidation rate between the liner layer 131 and the first conductive pattern 111, which are shown in FIG. 11A, a width Wb of the second part 133b of the blocking insulating layer 133 may be formed wider than that Wa of the first part 133a and that Wc of the third part 133c.

During the oxidation process, a portion of the sacrificial layer 103, a portion of the second conductive pattern 113, and a portion of the mask layer 121 may be oxidized. The oxidation rate of the first conductive pattern 111 is higher than that of each of the sacrificial layer 103, the second conductive pattern 113, and the mask layer 121. Therefore, although the portion of the sacrificial layer 103, the portion of the second conductive pattern 113, and the portion of the mask layer 121 are oxidized, the width Wb of the second part 133b may be formed wider than that Wa of the first part 133a and that Wc of the third part 133c.

Referring to FIG. 11C, the step of forming the multi-layer 130L shown in FIG. 10C may include step of sequentially depositing the data storage layer 135 and the tunnel insulating layer 137 along the uneven surface of the blocking insulating layer 133. The data storage layer 135 may extend along the inner wall of the blocking insulating layer 133, and the tunnel insulating layer 137 may extend along an inner wall of the data storage layer 135.

Figure 10D:
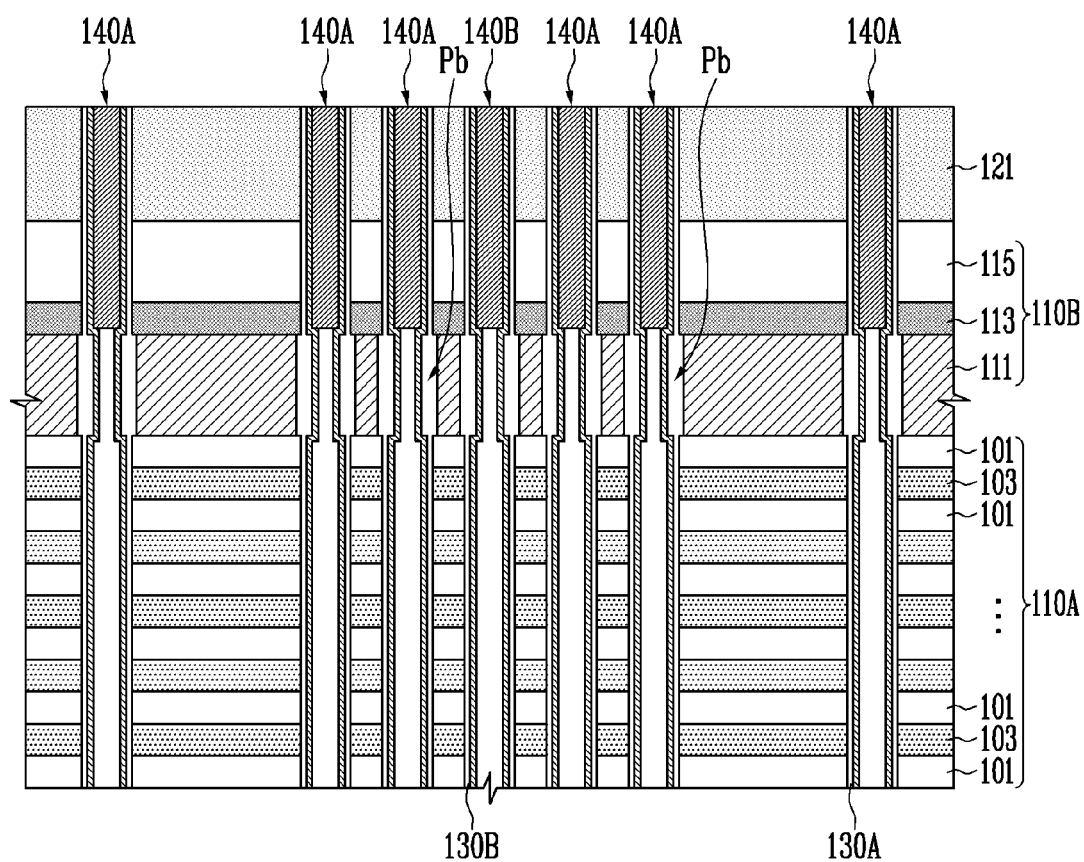

Referring to FIG. 10D, channel structures 140A may be formed in the holes 125A opened by the multi-layer 130L shown in FIG. 10C. In the step of forming the channel structures 140A, a preliminary dummy channel structure 140B filling the dummy hole 125B shown in FIG. 10C may be simultaneously formed with the channel structures 140A.

The top surface of the mask layer 121 may be exposed by removing the fourth part Pd of the multi-layer 130L shown in FIG. 10C. The multi-layer 130L may be isolated into memory layers 130A and a dummy memory layer 130B. The second part Pb may be defined as a protrusion part which defines an uneven surface at an inner wall of each of the memory layers 130A and the dummy memory layer 130B.

The memory layers 130A may respectively remain on sidewalls of the holes 125A shown in FIG. 10C. The dummy memory layer 130B may remain on a sidewall of the dummy hole 125B shown in FIG. 10C. The channel structures 140A may be respectively disposed on inner walls of the memory layers 130A, and fill the holes 125A. The preliminary dummy channel structure 140B may be disposed on an inner wall of the dummy memory layer 130B, and fill the dummy hole 125B.

Figure 11D:
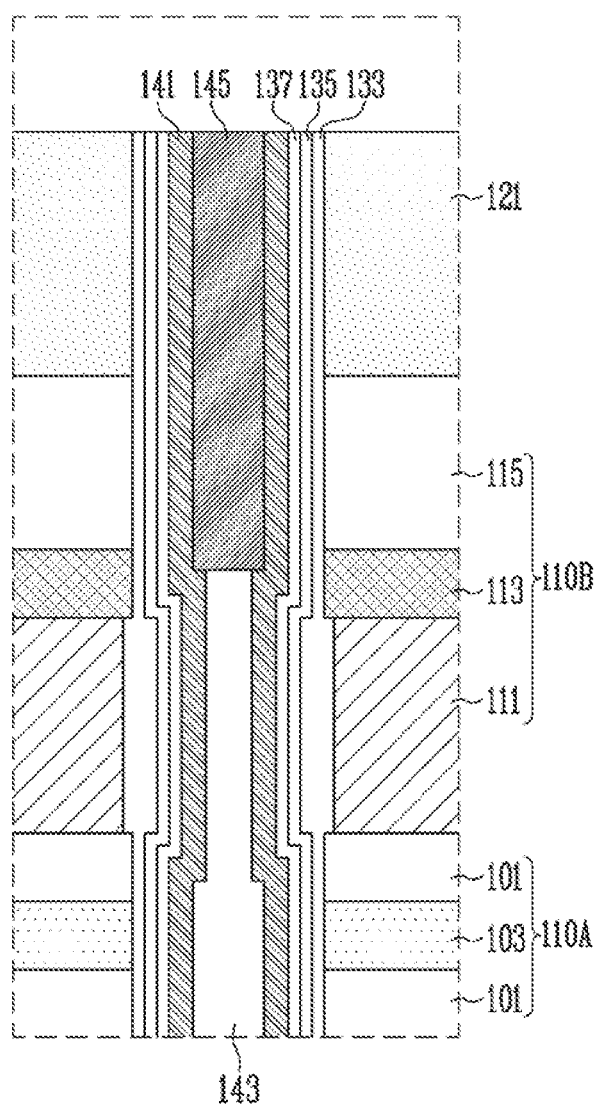

FIGS. 11C and 11D illustrate an embodiment of the step of forming the channel structure 140A and the preliminary dummy channel structure 140B.

Referring to FIG. 11C, the step of forming the channel structure 140A and the preliminary dummy channel structure 140B may include step of forming a channel layer 141 along the uneven surface of the multi-layer 130L and step of filling the first central region C1 and the second central region C2, which are opened by the channel layer 141, with a core insulating layer 143.

The channel layer 141 may include a protrusion part 141PP covering the second part Pb of the multi-layer 130L shown in FIG. 10C.

The core insulating layer 143 may be formed by depositing an insulating layer through atomic layer deposition (ALD). Accordingly, the core insulating layer 143 can fill the second central region C2 without any void, and thus a process defect due to the void can be minimized.

The insulating layer for the core insulating layer 143 may extend to the inside of the third central region C3. A portion of the insulating layer formed in the third central region C3 may be removed through an etching process. In an embodiment, the etching process may be performed through a wet etching process or a dry etching process. While the portion of the insulating layer is being etched, the protrusion part 141PP of the channel layer 141 may serve as an etch stop layer. Accordingly, the remaining height of the core insulating layer 143 can be uniformly controlled.

Referring to FIG. 11D, the third central region C3 opened on the core insulating layer 143 may be filled with a doped semiconductor pattern 145. The doped semiconductor pattern 145, the channel layer 141 shown in FIG. 11C, and the multi-layer 130L shown in FIG. 11C may be planarized such that the top surface of the mask layer 121 is exposed. Accordingly, as shown in FIG. 10D, the memory layers 130A and the dummy memory layer 130B, which are isolated from each other, and the channel structures 140A and the preliminary dummy channel structure 140B, which are isolated from each other, may be formed.

A portion of a sidewall of the doped semiconductor pattern 145 may be surrounded by the second conductive pattern 113. A top surface of the doped semiconductor layer 145 does not covered by the first stack structure 110A and the second stack structure 110B but may be opened. Accordingly, although a thermal diffusion process is not used, an impurity may be directly injected into the doped semiconductor pattern 145. The impurity is directly injected to the doped semiconductor pattern 145, so that a junction overlap of a memory cell string due to the doped semiconductor pattern 145 may be stably formed. In an embodiment, the impurity may also be injected into a partial region of the channel layer 141 in contact with the doped semiconductor pattern 145.

FIGS. 12A to 12D are sectional views illustrating an embodiment of subsequent processes performed after the channel structures 140A and the preliminary dummy channel structure 140B, which are shown in FIG. 10D.

Figure 12A:
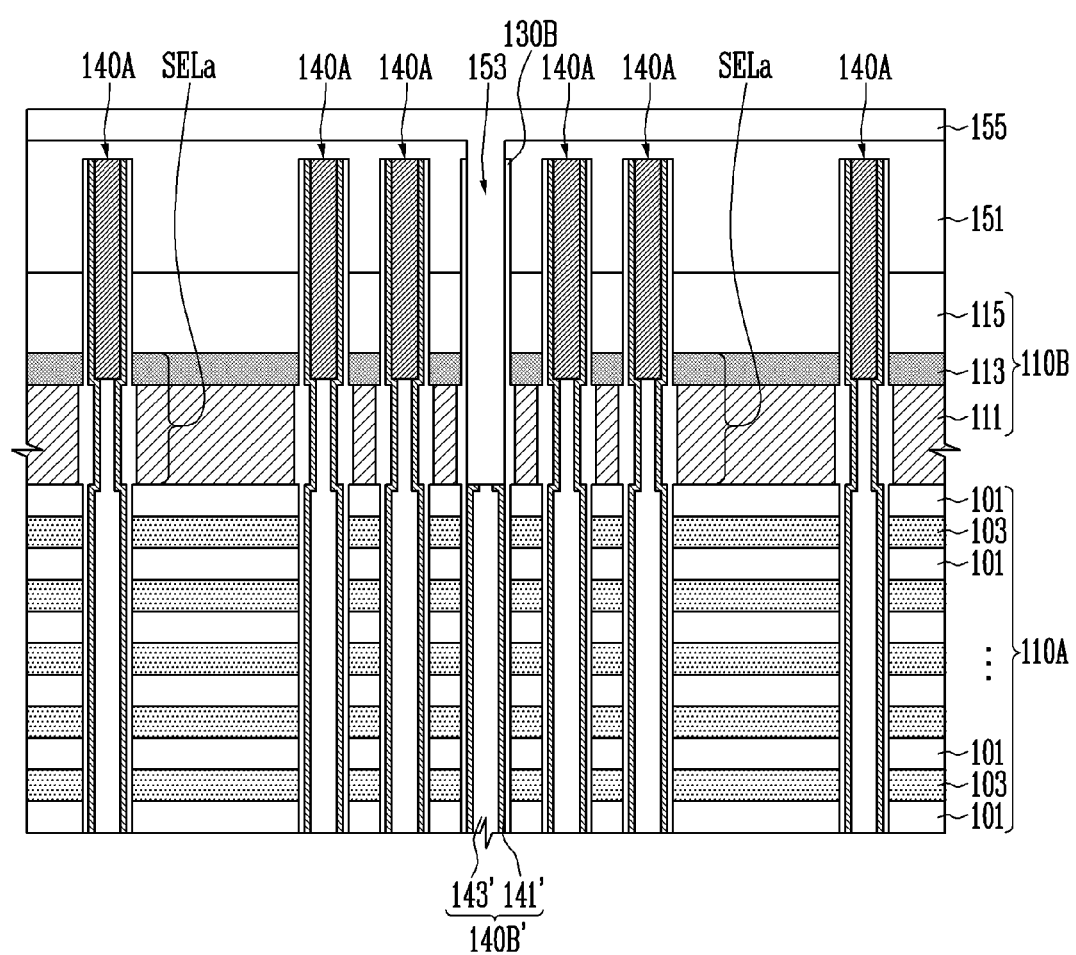

Referring to FIG. 12A, after the mask layer 121 shown in FIG. 10D is removed, a first upper insulating layer 151 may be formed. The first upper insulating layer 151 may cover the channel structures 140A and the preliminary dummy channel structure 140B, which are shown in FIG. 10D.

Subsequently, a first slit 153 may be formed, which penetrates the first upper insulating layer 151 and the second stack structure 110B. Each of the first conductive pattern 111 and the second conductive pattern 113 of the second stack structure 110B may be isolated into preliminary select lines SELa by the first slit 153. The first slit 153 may be defined by etching the first upper insulating layer 151, the second interlayer insulating layer 115, the second conductive pattern 113, and the first conductive pattern 111. The first upper insulating layer 151, the second interlayer insulating layer 115, the second conductive pattern 113, and the first conductive pattern 111 may be etched by using a photoresist pattern (not shown) as an etch barrier. The photoresist pattern may be formed through a photolithography process. After the first slit 153 is formed, the photoresist pattern may be removed.

The first conductive pattern 111 is selectively etched using an etch selectivity between the first conductive pattern 111 and an oxidation layer, so that the position of the first slit 153 may be controlled to be on the first stack structure 110A.

The first slit 153 may overlap with the preliminary dummy channel structure 140B shown in FIG. 10D. A portion of the preliminary dummy channel structure 140B overlapping with the first slit 153 may be removed while the first slit 153 is being formed. The preliminary dummy channel structure 140B shown in FIG. 10D may include the doped semiconductor pattern 145, the channel layer 141, and the core insulating layer 143, which are shown in FIG. 11D. While the first slit 153 is being formed, the doped semiconductor pattern 145 of the preliminary dummy channel structure 140B may be removed, and a portion of the channel layer 141 of the preliminary dummy channel structure 140B may be removed. After the portion of the channel layer 141 is removed, a portion of the channel layer 141, which remains in the dummy hole, may be defined as a dummy channel layer 141'. While the first slit 153 is being formed, a portion of the core insulating layer 143 of the preliminary dummy channel structure 140B may be removed. After the portion of the core insulating layer 143 is removed, a portion of the core insulating layer 143, which remains in the dummy hole, may be defined as a dummy core insulating layer 143'. The dummy core insulating layer 143' and the dummy channel layer 141' may define a dummy channel structure 140B'.

A portion of the dummy memory layer 130B, which further protrudes than the dummy channel structure 140B', may be exposed by the first slit 153. Subsequently, an isolation insulating layer 155 may be formed, which fills the first slit 153. The isolation insulating layer 155 may cover the portion of the dummy memory layer 130B, which further protrudes than the dummy channel structure 140B' and extend to cover the first upper insulating layer 151.

Figure 12B:
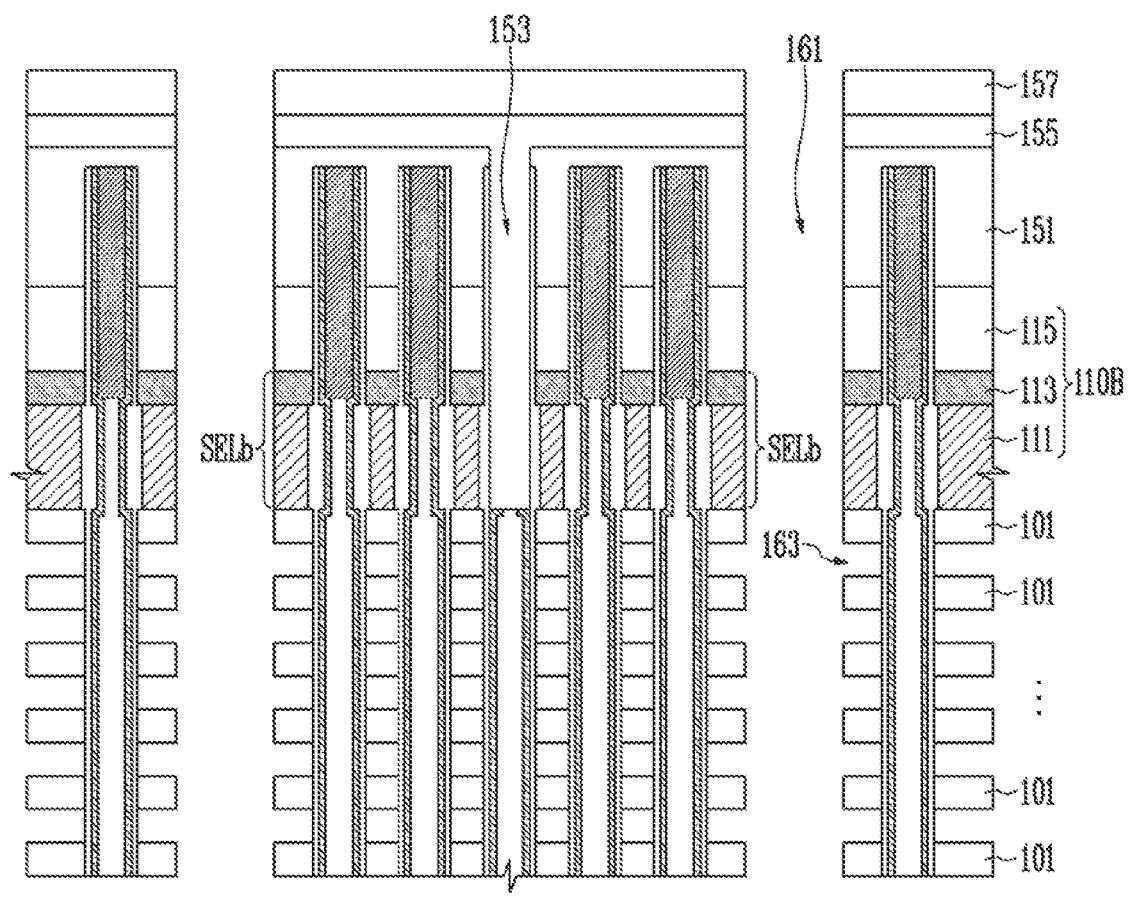

Referring to FIG. 12B, a second upper insulating layer 157 may be formed on the isolation insulating layer 155. Subsequently, a second slit 161 may be formed, which penetrates the second upper insulating layer 157, the isolation insulating layer 155, the first upper insulating layer 151, the second stack structure 110B, and the first stack structure 110A shown in FIG. 12A. Each of the first conductive pattern 111 and the second conductive pattern 113 of the second stack structure 110B may be isolated into select lines SELb by the first slit 153 and the second slit 161. The second slit 161 may be defined by etching the second upper insulating layer 157, the isolation insulating layer 155, the first upper insulating layer 151, the second stack structure 110B, and the first stack structure 110A shown in FIG. 12A, using, as an etch barrier, a photoresist pattern (not shown) formed through a photolithography process. After the second slit 161 is formed, the photoresist pattern may be removed.

Subsequently, the sacrificial layers 103 of the first stack structure 110A shown in FIG. 12A may be selectively removed through the second slit 161. Accordingly, horizontal spaces 163 may be defined between the first interlayer insulating layers 101.

Figure 12C:
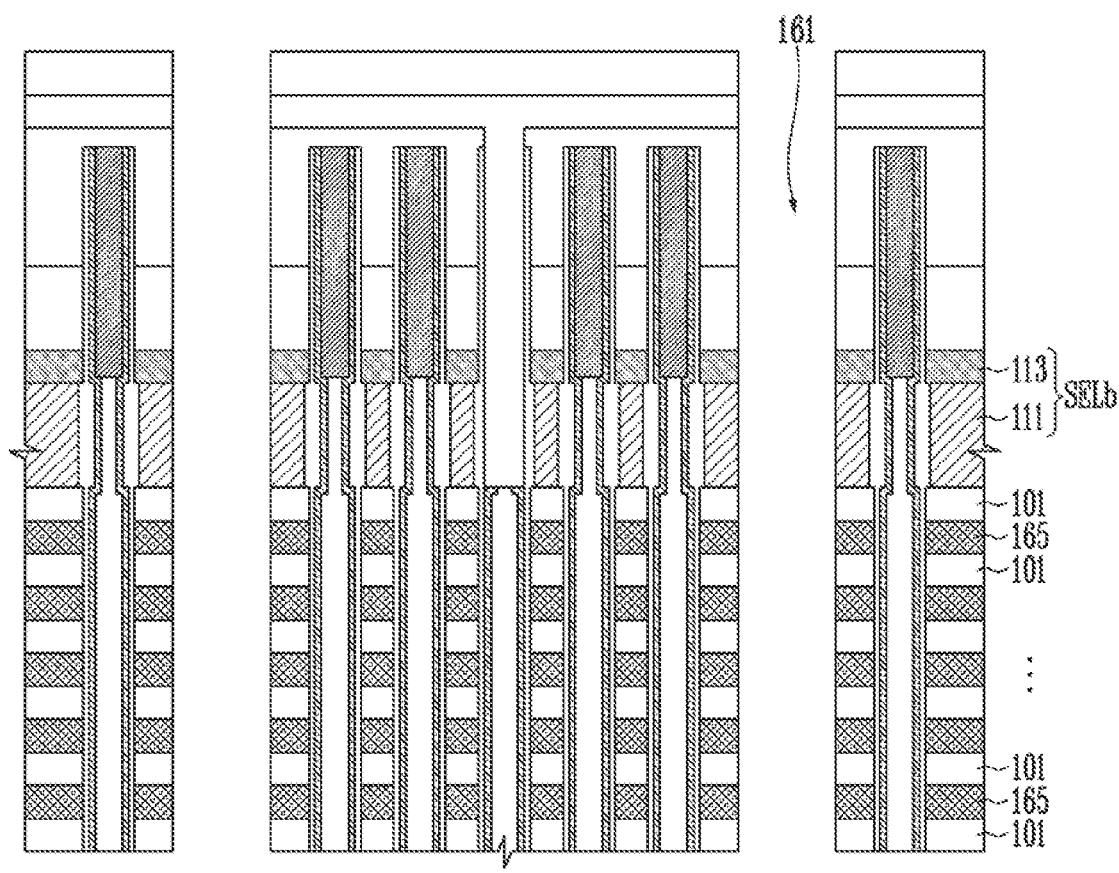

Referring to FIG. 12C, third conductive patterns 165 may be formed in the horizontal spaces shown in FIG. 12B. Before the third conductive patterns 165 are formed, a second blocking insulating layer may be formed on a surface of each of the horizontal spaces 163. The second blocking insulating layer may include an insulating material having a dielectric constant higher than that of the first blocking insulating layer 133 shown in FIG. 11D. In an embodiment, the second blocking insulating layer may include an aluminum oxide layer.

As described with reference to FIGS. 12B and 12C, the sacrificial layers 103 may be replaced with the third conductive patterns 165 through the second slit 161. When the select line SELb having a relatively thick thickness is formed, various process defects may occur when the sacrificial layer having a thick thickness is replaced with a conductive pattern. In accordance with an embodiment of the present disclosure, the first conductive pattern 111 and the third conductive pattern 113 are not replaced with the third conductive patterns 165, but may be patterned as the select line SELb having a relatively thick thickness through an etching process. Accordingly, process defects occurring in a process of replacing sacrificial layers having different thicknesses with conductive patterns may be fundamentally blocked.

Figure 12D:
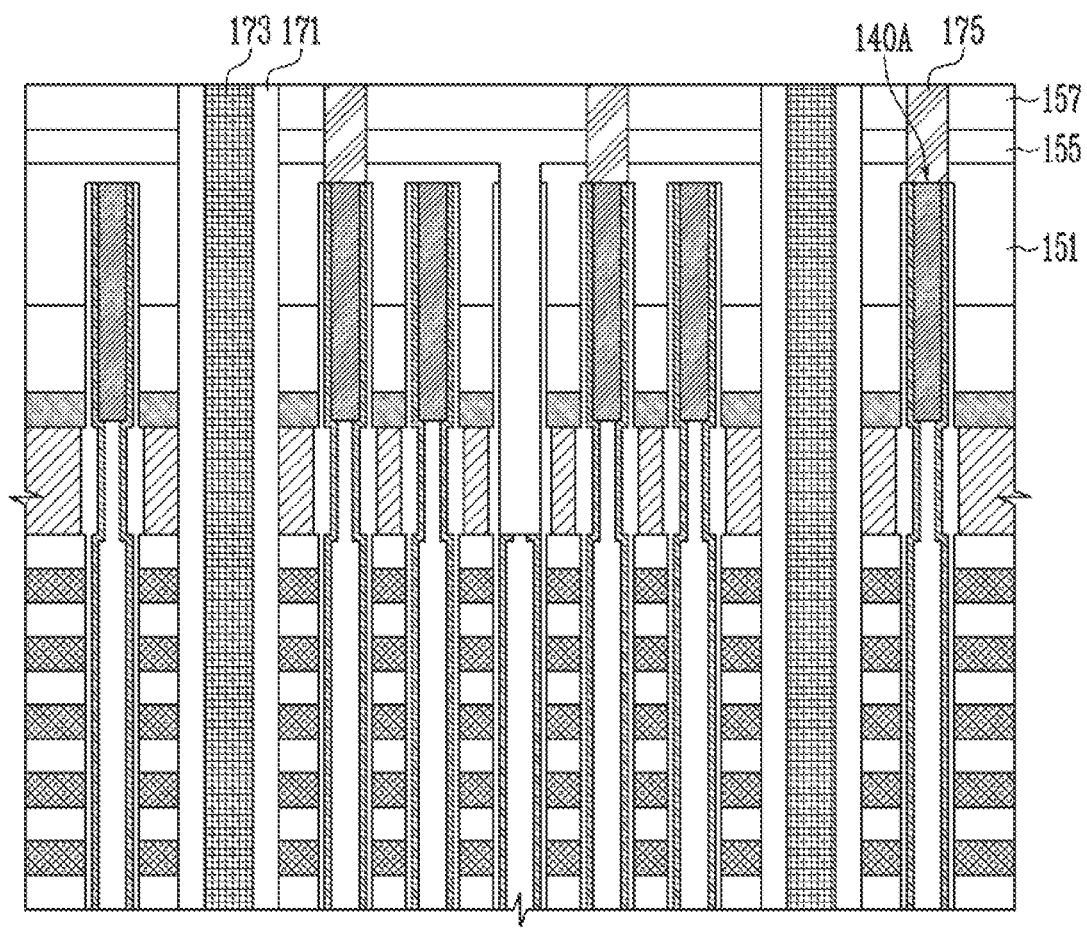

Referring to FIG. 12D, subsequent processes may be performed, such as a process of forming a spacer insulating layer 171 on a sidewall of the second slit 161 shown in FIG. 12C, a process of filling the second slit 161 opened by the spacer insulating layer 171 with a vertical structure 173, and a process of forming drain contact plugs 175 connected to the channel structures 140A.

In an embodiment, the vertical structure 173 may include a conductive material. In an embodiment, the drain contact plugs 175 may penetrate the second upper insulating layer 157 and the isolation insulating layer 155, and extend to the inside of the first upper insulating layer 151.

Figure 13:
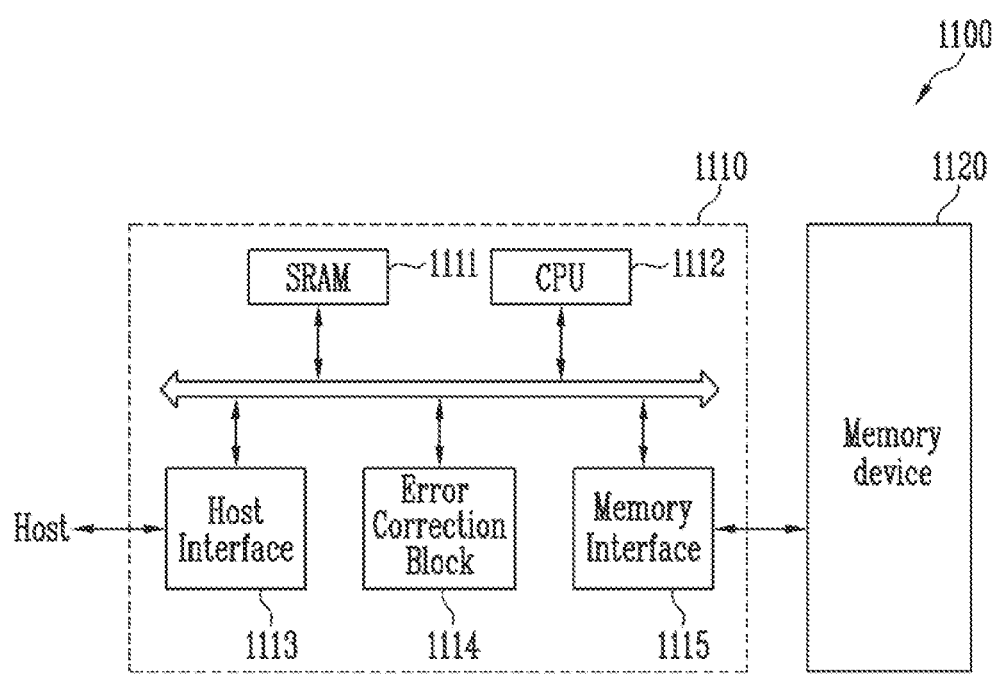
FIG. 13 is a block diagram illustrating a configuration of a memory system in accordance with an embodiment of the present disclosure.

FIG. 13 is a block diagram illustrating a configuration of a memory system 1100 in accordance with an embodiment of the present disclosure.

Referring to FIG. 13, the memory system 1100 includes a memory device 1120 and a memory controller 1110.

The memory device 1120 may include a select line penetrated by a hole, a memory layer formed on a sidewall of the hole, and a doped semiconductor pattern filling a portion of the hole. The select line may include a stack structure of conductive patterns having different oxidation rates. The memory layer may include a protrusion part protruding toward a central region of the hole on a sidewall of a conductive pattern having a relatively high oxidation rate. The doped semiconductor pattern may be aligned on the protrusion part of the memory layer. In an erase operation of the memory device 1120, a Gate Induced Drain Leakage (GIDL) current may be generated in the doped semiconductor pattern.

The memory device 1120 may be a multi-chip package configured with a plurality of flash memory chips.

The memory controller 1110 controls the memory device 1120, and may include a Static Random Access Memory (SRAM) 1111, a Central Processing Unit (CPU) 1112, a host interface 1113, an error correction block 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The error correction block 1114 detects and corrects an error included in a data read from the memory device 1120. The memory interface 1115 interfaces with the memory device 1120. The memory controller 1110 may further include a Read Only Memory (ROM) for storing code data for interfacing with the host, and the like.

Figure 14:
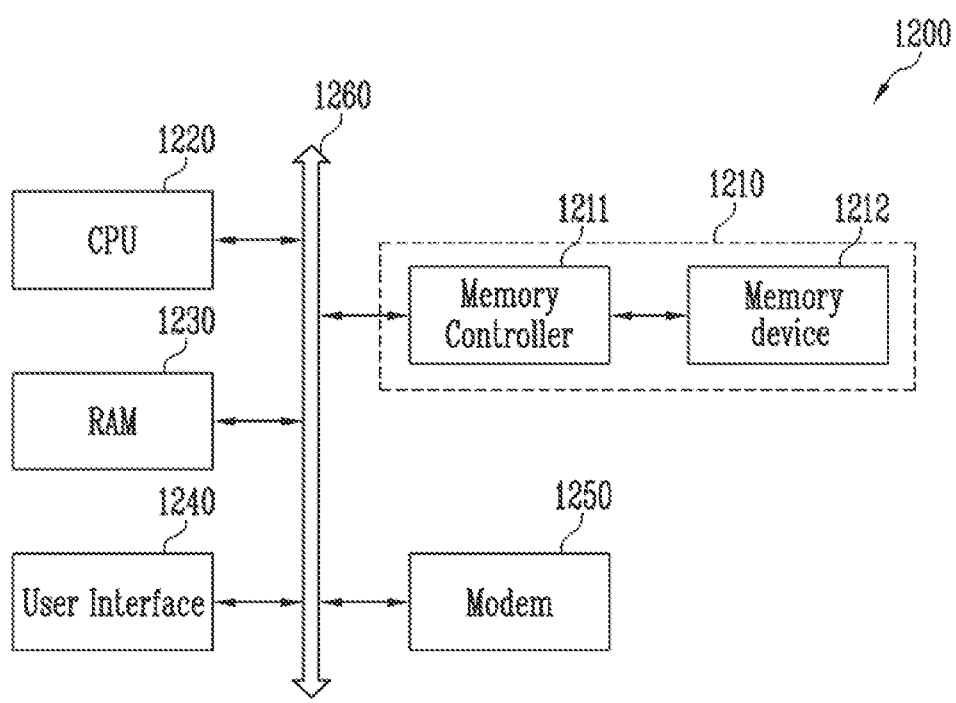
FIG. 14 is a block diagram illustrating a configuration of a computing system in accordance with an embodiment of the present disclosure.

FIG. 14 is a block diagram illustrating a configuration of a computing system in accordance with an embodiment of the present disclosure.

Referring to FIG. 14, the computing system 1200 in accordance with the embodiment of the present disclosure may include a CPU 1220, a random access memory (RAM) 1230, a user interface 1240, a modem 1250, and a memory system 1210, which are electrically connected to a system bus 1260. The computing system 1200 may be a mobile device.

The memory system 1210 may include a memory device 1212 and a memory controller 1211. The memory device 1212 may include a select line penetrated by a hole, a memory layer formed on a sidewall of the hole, and a doped semiconductor pattern filling a portion of the hole. The select line may include a stack structure of conductive patterns having different oxidation rates. The memory layer may include a protrusion part protruding toward a central region of the hole on a sidewall of a conductive pattern having a relatively high oxidation rate. The doped semiconductor pattern may be aligned on the protrusion part of the memory layer. In an erase operation of the memory device 1120, a Gate Induced Drain Leakage (GIDL) current may be generated in the doped semiconductor pattern.

In accordance with the present disclosure, by using conductive patterns having different oxidation rates, a width of a partial region of a blocking insulating layer extending along a sidewall of a conductive pattern having a high oxidation rate may be formed relatively wider than that of the other region of the blocking insulating layer, and the partial region of the blocking insulating layer may protrude.

In accordance with the present disclosure, by using the protruding partial region of the blocking insulating layer, a variation may be reduced, in which the position of a doped semiconductor pattern is out of a target range. Accordingly, a Gate Induced Drain Leakage (GIDL) current for an erase operation may be stably generated, and thus the operational reliability of the semiconductor memory device may be improved.

What is claimed is:

1. A semiconductor memory device comprising:
   a first stack structure including interlayer insulating layers and first conductive patterns, which are alternately stacked;
   a second stack structure including a second conductive pattern overlapping with the first stack structure, and a third conductive pattern overlapping with the first stack structure with the second conductive pattern interposed between the first stack structure and the third conductive pattern, the third conductive pattern having an oxidation rate different from that of the second conductive pattern;
   channel structures penetrating the first stack structure and the second stack structure; and
   a bit line overlapping with the first stack structure with the second stack structure interposed between the first stack structure and the bit line.

2. The semiconductor memory device of claim 1, wherein the second conductive pattern further spaced apart from the bit line than the third conductive pattern includes a conductive material having an oxidation rate higher than that of the third conductive pattern.

3. The semiconductor memory device of claim 1, wherein the second conductive pattern includes silicon, and
   the third conductive pattern includes a conductive material having a resistivity lower than that of the silicon.

4. The semiconductor memory device of claim 1, wherein the second conductive pattern includes silicon, and
   the third conductive pattern includes a tungsten silicide layer.

5. The semiconductor memory device of claim 1, further comprising a slit penetrating the second stack structure,
   wherein each of the second conductive pattern and the third conductive pattern is isolated into a first select line and a second select line by the slit.

6. The semiconductor memory device of claim 5, wherein the channel structures include:
   a first channel structure penetrating the first select line and the first stack structure; and
   a second channel structure penetrating the second select line and the first stack structure, wherein the first conductive patterns extend to surround the first channel structure and the second channel structure.

7. The semiconductor memory device of claim 6, further comprising:
a dummy channel structure penetrating the first stack structure between the first channel structure and the second channel structure;
a dummy memory layer surrounding a sidewall of the dummy channel structure; and
an isolation insulating layer overlapping with the dummy channel structure, the isolation insulating layer being disposed between the first select line and the second select line.

8. The semiconductor memory device of claim 1, further comprising:
a tunnel insulating layer surrounding a sidewall of each of the channel structures;
a data storage layer surrounding a sidewall of the tunnel insulating layer; and
a blocking insulating layer surrounding a sidewall of the data storage layer,
wherein the blocking insulating layer includes a first part between the first stack structure and the data storage layer, a second part between the data storage layer and the second conductive pattern, and a third part between the data storage layer and the third conductive pattern,
where the second part of the blocking insulating layer is formed to have a width greater than that of each of the first part and the third part.

9. The semiconductor memory device of claim 8, wherein the second part of the blocking insulating layer further protrudes toward the channel structure than the first part and the third part.

10. The semiconductor memory device of claim 8, further comprising a source layer overlapping with the bit line with the first stack structure and the second stack structure, which are interposed between the bit line and the source layer,
wherein each of the channel structures penetrates the tunnel insulating layer, the data storage layer, and the blocking insulating layer, and includes a bottom surface in contact with the source layer.

11. The semiconductor memory device of claim 8, further comprising:
a first source layer overlapping with the first stack structure; and
a second source layer disposed between the first source layer and the first stack structure,
wherein the channel structures include end portions extending to the inside of the first source layer,
wherein the second source layer is in contact with the sidewalls of the channel structures,
wherein the tunnel insulating layer, the data storage layer, and the blocking insulating layer are isolated into a first memory pattern and the second memory pattern by the second source layer, the first memory pattern disposed between each of the channel structures and the first stack structure, the second memory pattern disposed between each of the channel structures and the first source layer.

12. The semiconductor memory device of claim 8, further comprising a source layer overlapping with the first stack structure,
wherein each of the channel structures further extends to the inside of the source layer than the tunnel insulating layer, the data storage layer, and the blocking insulating layer, and includes an end portion in contact with the source layer.

13. The semiconductor memory device of claim 1, wherein each of the channel structures includes:
a core insulating layer surrounded by the first stack structure and the second conductive pattern;
a doped semiconductor pattern overlapping with the core insulating layer, the doped semiconductor pattern being surrounded by the third conductive pattern; and
a channel layer extending along a sidewall of the core insulating layer and a sidewall of the doped semiconductor pattern.

14. The semiconductor memory device of claim 13, wherein the channel layer includes:
a first part disposed between the first stack structure and the core insulating layer;
a second part extending from the first part, the second part being disposed between the second conductive pattern and the core insulating layer; and
a third part extending from the second part, the third part surrounding the sidewall of the doped semiconductor pattern,
wherein the second part further protrudes toward the core insulating layer than the first part and the third part.

15. The semiconductor memory device of claim 1, wherein the second conductive pattern is formed thicker than each of the first conductive patterns and the third conductive pattern.

16. A semiconductor memory device comprising:
a core insulating layer including a first part and a second part extending from the first part;
a doped semiconductor pattern overlapping with the first part of the core insulating layer with the second part interposed between the first part and the doped semiconductor pattern;
a first blocking insulating layer extending along a sidewall of the core insulating layer and a sidewall of the doped semiconductor pattern, the first blocking insulating layer protruding toward the second part of the core insulating layer;
a channel layer extending between the first blocking insulating layer and the doped semiconductor pattern and between the first blocking insulating layer and the core insulating layer;
a tunnel insulating layer disposed between the channel layer and the first blocking insulating layer;
a data storage layer disposed between the tunnel insulating layer and the first blocking insulating layer; and
a gate stack structure surrounding the first blocking insulating layer.

17. The semiconductor memory device of claim 16, wherein the gate stack structure includes:
a first stack structure surrounding the first part of the core insulating layer, the first stack structure including a first conductive pattern and an interlayer insulating layer, which are alternately stacked;
a second conductive pattern overlapping with the first stack structure, the second conductive pattern surrounding the second part of the core insulating layer; and
a third conductive pattern overlapping with the second conductive pattern, the third conductive pattern surrounding the doped semiconductor pattern.

18. The semiconductor memory device of claim 17, wherein the first blocking insulating layer protrudes toward the second conductive pattern between the third conductive pattern and the first stack structure.

19. The semiconductor memory device of claim 17, wherein the second conductive pattern includes silicon, and the third conductive pattern includes a conductive material having a resistivity lower than that of the silicon.

20. The semiconductor memory device of claim 17, wherein the second conductive pattern includes silicon, and the third conductive pattern includes a tungsten silicide layer.

21. The semiconductor memory device of claim 17, wherein the second conductive pattern is formed thicker than each of the first conductive pattern and the third conductive pattern.

22. The semiconductor memory device of claim 17, further comprising a second blocking insulating layer extending between the first conductive pattern and the interlayer insulating layer and between the first conductive pattern and the first blocking insulating layer,
   wherein the first blocking insulating layer is in contact with each of the second conductive pattern and the third conductive pattern.

* * * * *